(12) United States Patent
Mitsunaga et al.

(10) Patent No.: US 8,896,028 B2
(45) Date of Patent: Nov. 25, 2014

(54) SEMICONDUCTOR DEVICE, MANUFACTURING METHOD THEREOF, PROTECTIVE ELEMENT, AND MANUFACTURING METHOD THEREOF

(71) Applicant: Sony Corporation, Tokyo (JP)

(72) Inventors: Masahiro Mitsunaga, Kagoshima (JP); Shinichi Tamari, Kagoshima (JP); Yuji Ibusuki, Kagoshima (JP)

(73) Assignee: Sony Corporation, Tokyo (JP)

( * ) Notice: Subject to any disclaimer, the term of this patent is extended or adjusted under 35 U.S.C. 154(b) by 64 days.

(21) Appl. No.: 13/755,871

(22) Filed: Jan. 31, 2013

(65) Prior Publication Data

US 2013/0221408 A1    Aug. 29, 2013

(30) Foreign Application Priority Data

Feb. 28, 2012    (JP) .................... 2012-041113

(51) Int. Cl.

| H01L 29/66 | (2006.01) |
|---|---|
| H01L 21/761 | (2006.01) |
| H01L 27/06 | (2006.01) |
| H01L 27/02 | (2006.01) |
| H01L 21/8252 | (2006.01) |
| H01L 29/06 | (2006.01) |

(52) U.S. Cl.
CPC .......... *H01L 29/0646* (2013.01); *H01L 21/761* (2013.01); *H01L 27/0605* (2013.01); *H01L 27/0296* (2013.01); *H01L 21/8252* (2013.01)
USPC ....... 257/194; 257/195; 257/E29.31; 438/172

(58) Field of Classification Search
USPC ..................... 257/194, 195, E29.31; 438/172
See application file for complete search history.

(56) References Cited

U.S. PATENT DOCUMENTS

| 5,250,826 A * | 10/1993 | Chang et al. .................. 257/273 |
| 6,365,925 B2 | 4/2002 | Hase et al. |
| 2011/0024798 A1* | 2/2011 | Tamari et al. ................. 257/195 |
| 2013/0256829 A1* | 10/2013 | Kikkawa ....................... 257/506 |

FOREIGN PATENT DOCUMENTS

| JP | 2002-343813 | 11/2002 |
| JP | 2006-032582 | 2/2006 |
| JP | 2008-041784 | 2/2008 |
| JP | 2010-010262 | 1/2010 |

* cited by examiner

*Primary Examiner* — Daniel Whalen
(74) *Attorney, Agent, or Firm* — Rader, Fishman & Grauer PLLC

(57) ABSTRACT

A semiconductor device includes: an epitaxial substrate formed by stacking a plurality of kinds of semiconductors over one semiconductor substrate by epitaxial growth; a field effect transistor of a first conductivity type formed in a first region; a field effect transistor of a second conductivity type formed in a second region; and a protective element formed in a third region. The protective element includes: a first stacking structure formed by etching the epitaxial substrate by vertical etching that proceeds in a stacking thickness direction; and a second stacking structure formed by etching the epitaxial substrate by vertical etching that proceeds in a stacking thickness direction. The protective element has two PN junctions on a current path formed between an upper end of the first stacking structure and an upper end of the second stacking structure via a base part of the first stacking structure and the second stacking structure.

15 Claims, 14 Drawing Sheets

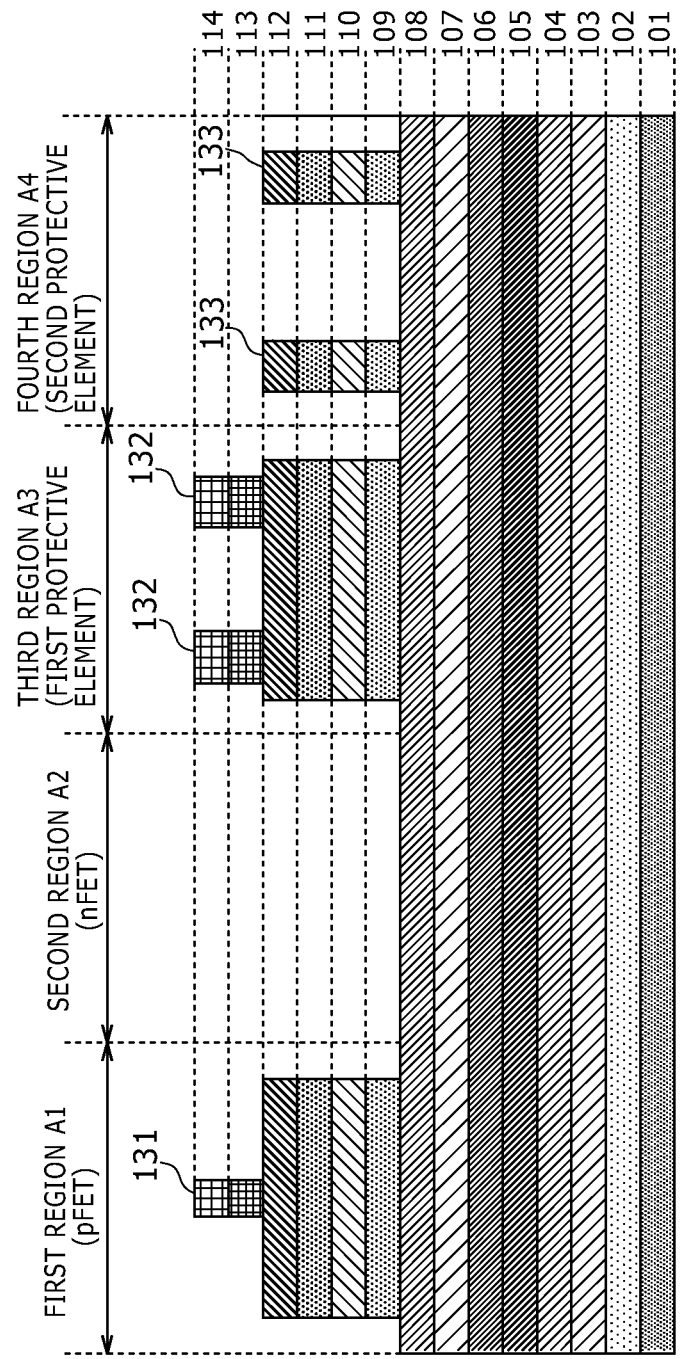

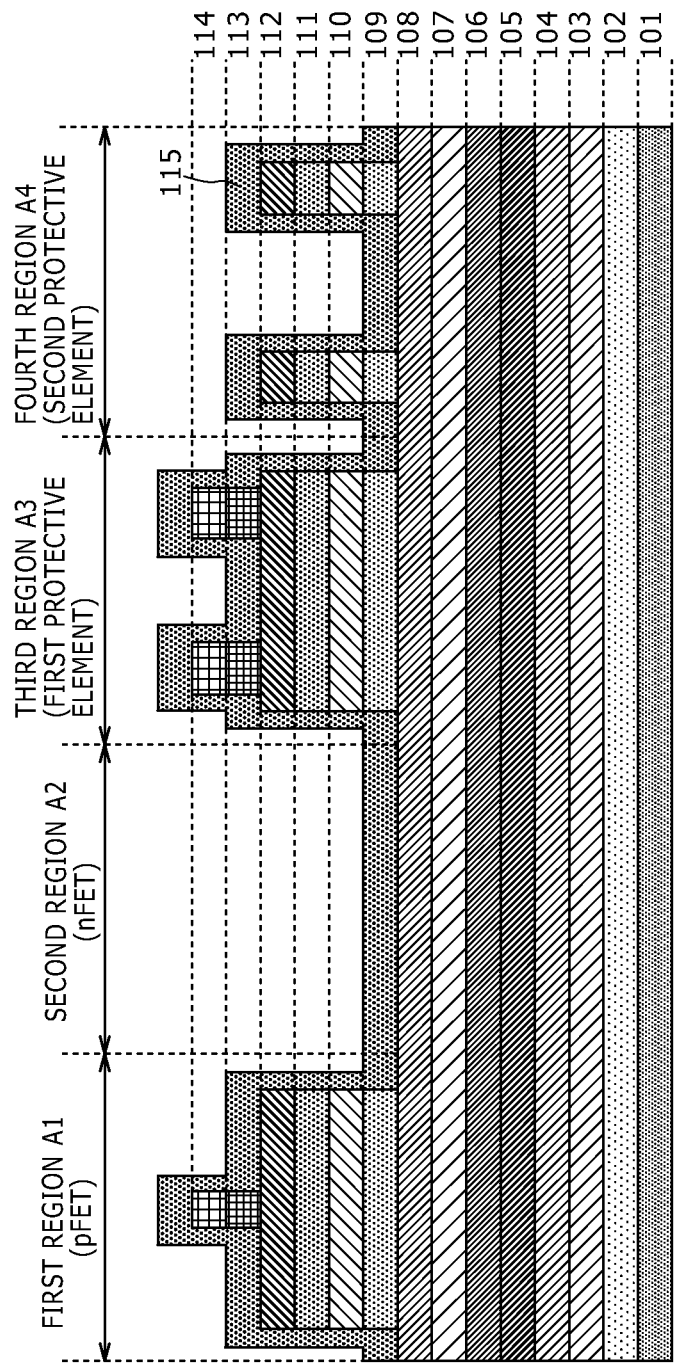

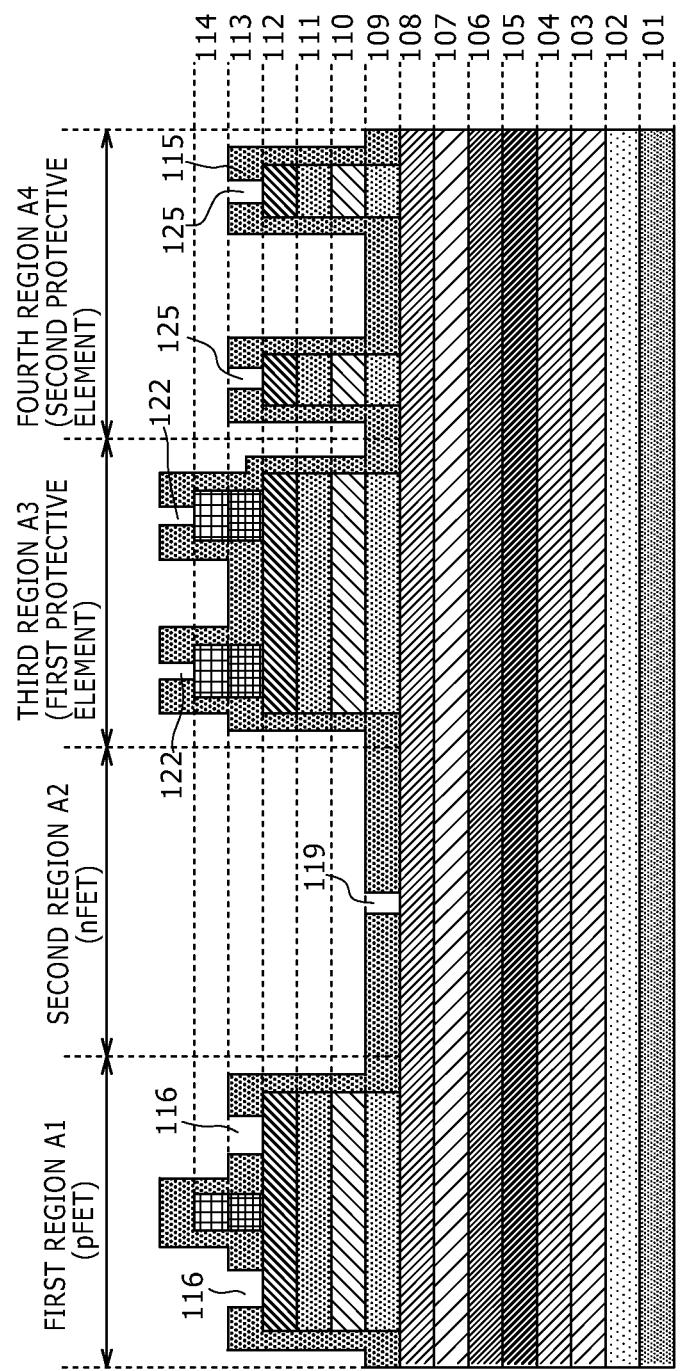

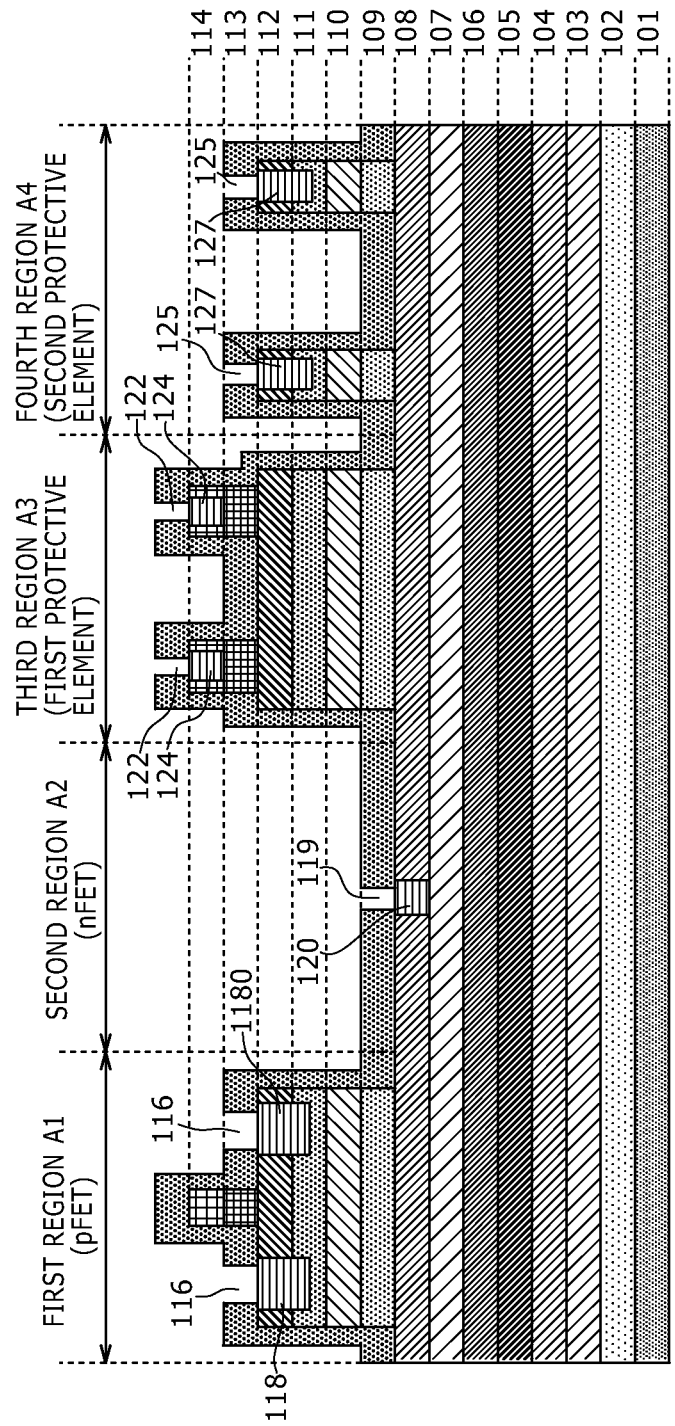

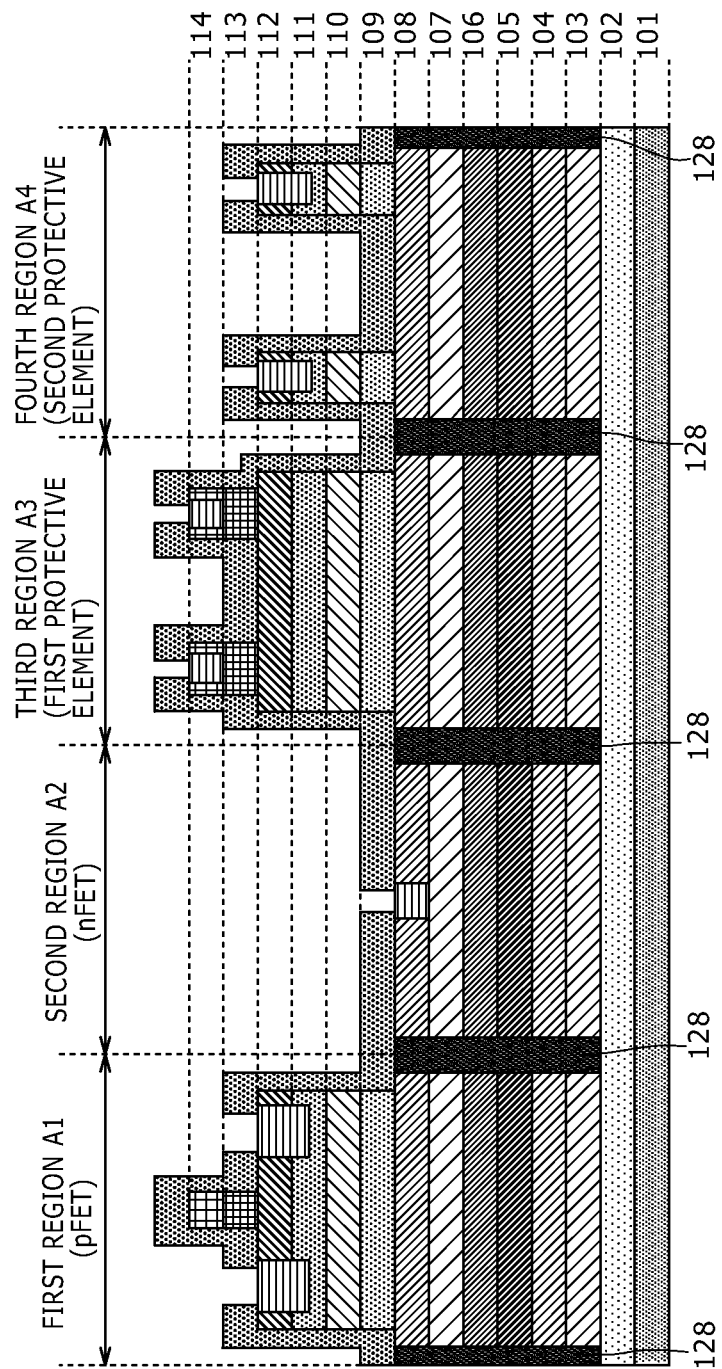

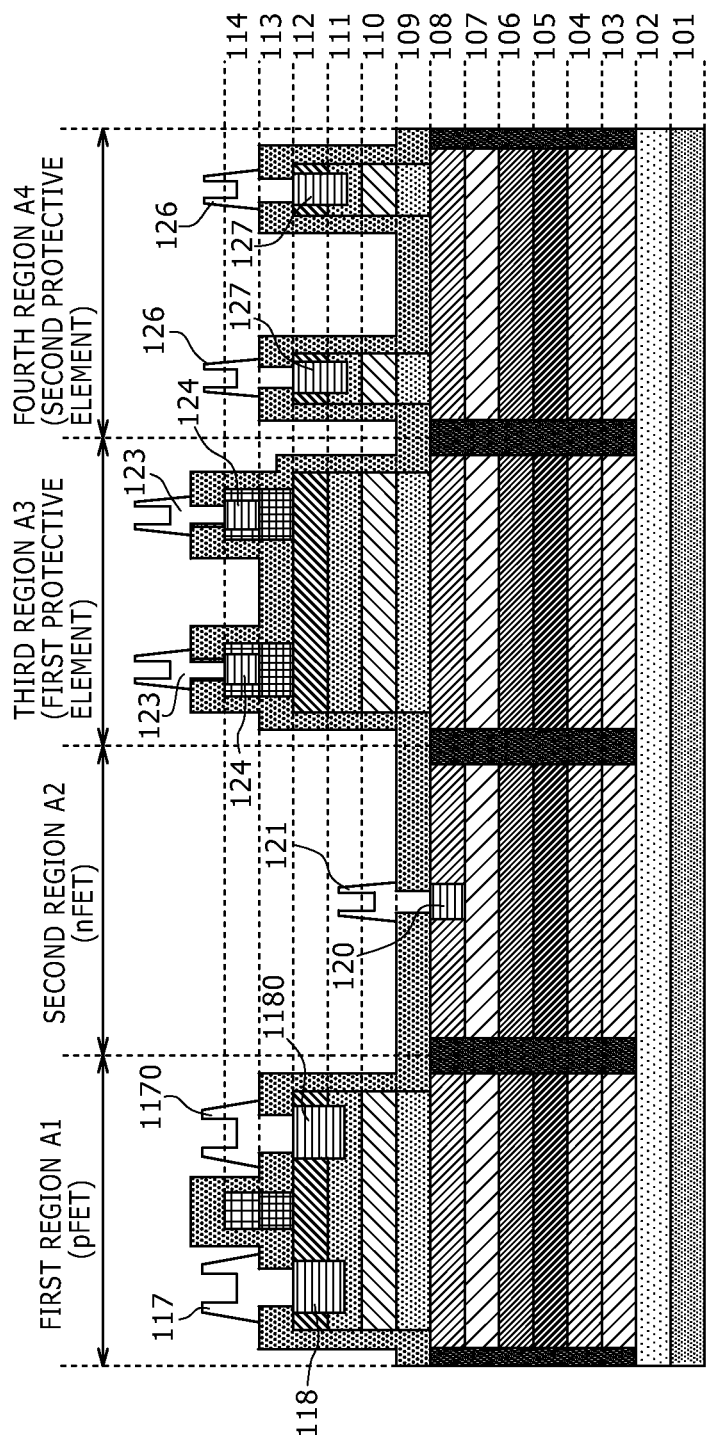

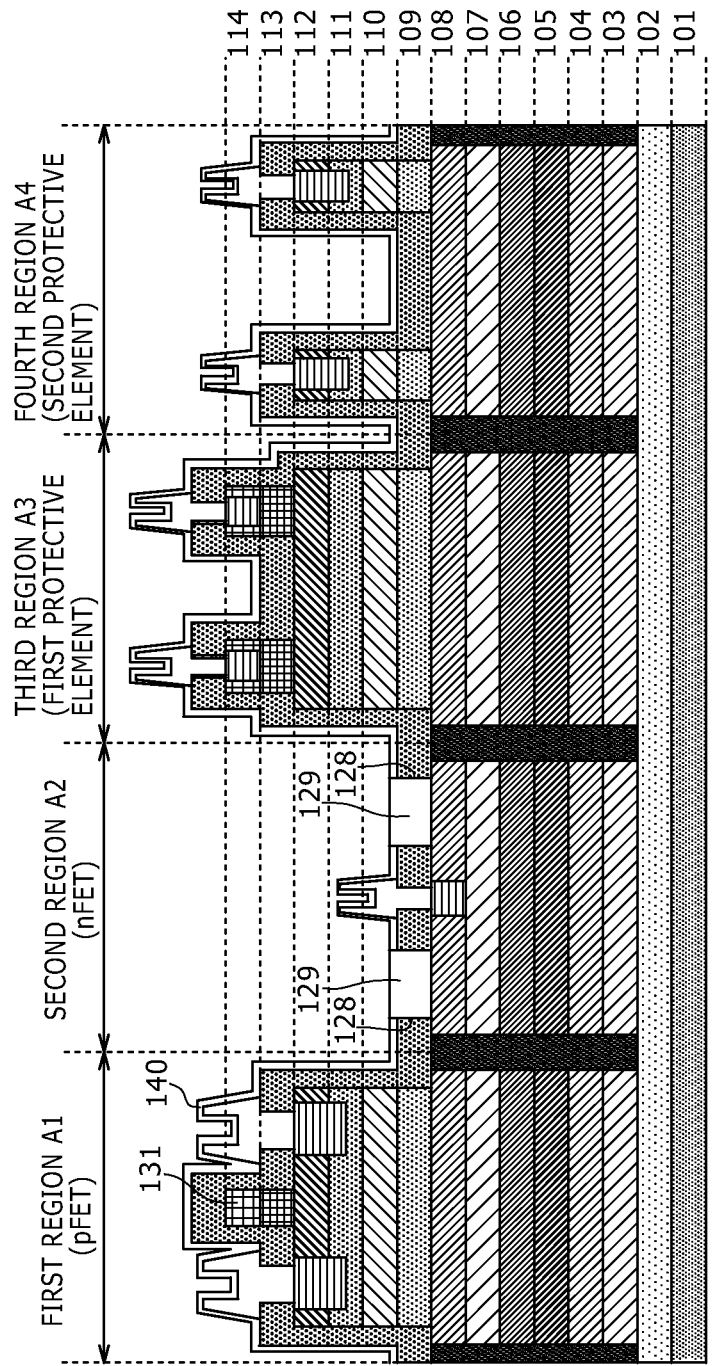

SEMICONDUCTOR DEVICE, MANUFACTURING METHOD THEREOF, PROTECTIVE ELEMENT, AND MANUFACTURING METHOD THEREOF

BACKGROUND

The present technique relates to a semiconductor device, a manufacturing method of a semiconductor device, a protective element, and a manufacturing method of a protective element.

A compound semiconductor-based field effect transistor (FET) having a compound semiconductor layer such as a GaAs-based layer has high electron mobility and therefore the frequency characteristic thereof with an re-channel is favorable. Presently, examples of the FET using an n-channel used for a high-frequency band include HEMT and JPHEMT (refer to e.g. Japanese Patent Laid-open No. Hei 11-150264 (hereinafter, referred to as Patent Document 1)). The HEMT is the abbreviation of the high electron mobility transistor and the JPHEMT is the abbreviation of the junction pseudomorphic high electron mobility transistor.

A switching element such as a field effect transistor for large current is required to have a high reverse withstand voltage and low on-resistance. However, in the compound semiconductor-based field effect transistor (hereinafter, referred to as the FET), a surge resistance of its gate electrode and drain electrode is not so high as that required for the FET having desired use purpose, structure, and size.

There have been proposed structures in which a protective element configured to protect the gate electrode and the drain electrode from a surge is incorporated in a FET (refer to e.g. Japanese Patent Laid-open Nos. 2006-32582, 2002-343813, 2010-10262, and 2008-41784 (hereinafter, referred to as Patent Documents 2 to 5, respectively)).

For example, in a structure of Patent Document 2, a channel layer and a barrier layer are sequentially stacked over a GaAs semiconductor substrate with the intermediary of a buffer layer. An n$^+$GaAs layer is formed on the barrier layer and an n$^-$GaAs layer is formed on the n$^+$GaAs layer. A p-type emitter region and a p-type collector region are formed on the surface of the n$^-$GaAs layer.

In this structure, a PNP protective element is formed by a PN junction formed between the p-type emitter region and the n$^+$GaAs layer and the n$^-$GaAs layer and a PN junction formed between the p-type collector region and the n$^+$GaAs layer and the n$^-$GaAs layer.

In this PNP protective element, a current flows in only the n$^-$GaAs layer in normal operation and a current flows in not only the n$^-$GaAs layer but also the n$^+$GaAs layer when a surge enters the device. Thus, the compound semiconductor device including this PNP protective element has enhanced surge resistance.

For example, in a semiconductor device described in Patent Document 5, a buffer layer of a GaAs film, a first carrier supplying layer of an n$^+$AlGaAs film, a first spacer layer of an i-AlGaAs film, a channel layer of an InGaAs film, a second spacer layer of an i-AlGaAs film, a second carrier supplying layer of an n$^+$AlGaAs film, a barrier layer of an n$^-$AlGaAs film, and a first conductive layer of an n$^+$GaAs film are sequentially formed over a GaAs semiconductor substrate by an epitaxial growth method. Furthermore, a first interlayer insulating film of e.g. a silicon nitride film or a silicon oxide film is formed thereon.

In this semiconductor device, two apertures for diffusion are formed in the first interlayer insulating film by etching with use of a resist mask and a P-type atom such as zinc (Zn) is diffused from the apertures for diffusion into the first conductive layer to form a second conductive layer. Thereby, a PN junction surface is formed between the first conductive layer and the second conductive layer. By connecting the second conductive layer formed in this manner by a first metal film, a connection of first conductive layer (N-type)-second conductive layer (P-type)-first metal film-second conductive layer (P-type)-first conductive layer (N-type) is made, so that a protective element having an NPN structure is formed.

SUMMARY

However, all of the protective elements described in Patent Documents 2 to 5 are formed by impurity diffusion. For example, the p-type emitter region and the p-type collector region configured to form the PNP protective element described in Patent Document 2 are formed by gas-phase diffusion of a p-type impurity such as Zn.

Enhancement in the performance of the n-channel FET is being advanced as described above. In addition, because increase in the degree of integration is required, development of a complementary element is necessary. In the complementary element, n-channel FET and p-channel FET are formed over one substrate in the same process.

However, in all of the protective elements described in Patent Documents 2 to 5, a current flows in a surface direction of the stacked semiconductor layers due to the PNP junction or NPN junction forming the protective element. The protective element employing the configuration in which a current flows in the surface direction tends to have a large occupancy area and therefore has disadvantages such as the lowering of the degree of element integration and the lowering of the flexibility of an element design.

A method using an ion implantation technique is known as a method adapted to simultaneously form re-channel FET and p-channel FET over a compound semiconductor. In this method, a p-type dopant and an n-type dopant are implanted into different regions over the same substrate to form an n-channel region and a p-channel region. However, in this ion implantation technique method, a high-temperature annealing step at 800° C. or higher is necessary after the ion implantation in order to activate the implanted dopant.

However, a heterojunction is often used between layers in the case of a compound semiconductor and this heterojunction is formed by the epitaxial growth method at a temperature of about 600° C. Therefore, if high-temperature annealing at 800° C. or higher is performed, interdiffusion of a compound composition element and an impurity element occurs at a heterojunction interface and it becomes difficult to realize the intended heterojunction.

The ion implantation technique method needs to be used to enhance the performance of a protective element and other elements by disposing an i-type semiconductor or introducing a heterojunction in a PNP structure or an NPN structure in the protective element employing a configuration in which a current flows in the surface direction. However, this method cannot be employed because high-temperature annealing makes it difficult to realize the intended junction.

There is a need for the present technique to provide a semiconductor device having a structure that permits a wide variety of element design and enables easy enhancement in the performance, the degree of integration, the withstand voltage, and so forth of the semiconductor device, a manufacturing method of this semiconductor device, a protective element, and a manufacturing method of this protective element.

According to an embodiment of the present technique, there is provided a semiconductor device including: an epitaxial substrate formed by stacking a plurality of kinds of semiconductors over one semiconductor substrate by epitaxial growth; a field effect transistor of a first conductivity type formed in a first region of the epitaxial substrate by utilizing a stacking structure of the epitaxial substrate; a field effect transistor of a second conductivity type formed in a second region different from the first region of the epitaxial substrate by utilizing a stacking structure of the epitaxial substrate; and a protective element formed in a third region different from the first region and the second region of the epitaxial substrate by utilizing a stacking structure of the epitaxial substrate. The protective element includes: a first stacking structure formed by etching the epitaxial substrate by vertical etching that proceeds in a stacking thickness direction; and a second stacking structure formed by etching the epitaxial substrate by vertical etching that proceeds in a stacking thickness direction. The protective element has two PN junctions on a current path formed between an upper end of the first stacking structure and an upper end of the second stacking structure via a base part of the first stacking structure and the second stacking structure.

According to another embodiment of the present technique, there is provided a manufacturing method of a semiconductor device. The method includes: forming an epitaxial substrate by stacking a plurality of kinds of semiconductors over one semiconductor substrate by epitaxial growth; forming a field effect transistor of a first conductivity type in a first region of the epitaxial substrate by utilizing a stacking structure of the epitaxial substrate; forming a field effect transistor of a second conductivity type in a second region different from the first region of the epitaxial substrate by utilizing a stacking structure of the epitaxial substrate; and forming a protective element in a third region different from the first region and the second region of the epitaxial substrate by utilizing a stacking structure of the epitaxial substrate. Forming the protective element includes: forming a first stacking structure by etching the epitaxial substrate by vertical etching that proceeds in a stacking thickness direction; and forming a second stacking structure by etching the epitaxial substrate by vertical etching that proceeds in a stacking thickness direction. By forming the protective element, two PN junctions are formed on a current path formed between an upper end of the first stacking structure and an upper end of the second stacking structure via a base part of the first stacking structure and the second stacking structure.

According to a further embodiment of the present technique, there is provided a protective element including: an epitaxial substrate formed by stacking a plurality of kinds of semiconductors by epitaxial growth; a first stacking structure formed by etching the epitaxial substrate by vertical etching that proceeds in a stacking thickness direction; and a second stacking structure formed by etching the epitaxial substrate by vertical etching that proceeds in a stacking thickness direction. Two PN junctions exist on a current path formed between an upper end of the first stacking structure and an upper end of the second stacking structure via a base part of the first stacking structure and the second stacking structure.

According to a still further embodiment of the present technique, there is provided a manufacturing method of a protective element. The method includes: forming an epitaxial substrate by stacking a plurality of kinds of semiconductors by epitaxial growth; forming a first stacking structure by etching the epitaxial substrate by vertical etching that proceeds in a stacking thickness direction; and forming a second stacking structure by etching the epitaxial substrate by vertical etching that proceeds in a stacking thickness direction. Two PN junctions are formed on a current path formed between an upper end of the first stacking structure and an upper end of the second stacking structure via a base part of the first stacking structure and the second stacking structure by forming the epitaxial substrate, forming the first stacking structure, and forming the second stacking structure.

According to the embodiments of the present technique, a wide variety of element design is permitted and easy enhancement in the performance, the degree of integration, the withstand voltage, and so forth of the semiconductor device is enabled.

BRIEF DESCRIPTION OF THE DRAWINGS

FIG. 2C is a schematic diagram showing the manufacturing step of the semiconductor device according to the first embodiment;

FIG. 2D is a schematic diagram showing the manufacturing step of the semiconductor device according to the first embodiment;

FIG. 2E is a schematic diagram showing the manufacturing step of the semiconductor device according to the first embodiment;

FIG. 2F is a schematic diagram showing the manufacturing step of the semiconductor device according to the first embodiment;

FIG. 2G is a schematic diagram showing the manufacturing step of the semiconductor device according to the first embodiment;

FIG. 2H is a schematic diagram showing the manufacturing step of the semiconductor device according to the first embodiment;

FIG. 2I is a schematic diagram showing the manufacturing step of the semiconductor device according to the first embodiment;

DETAILED DESCRIPTION OF THE PREFERRED EMBODIMENTS

Figure 1:
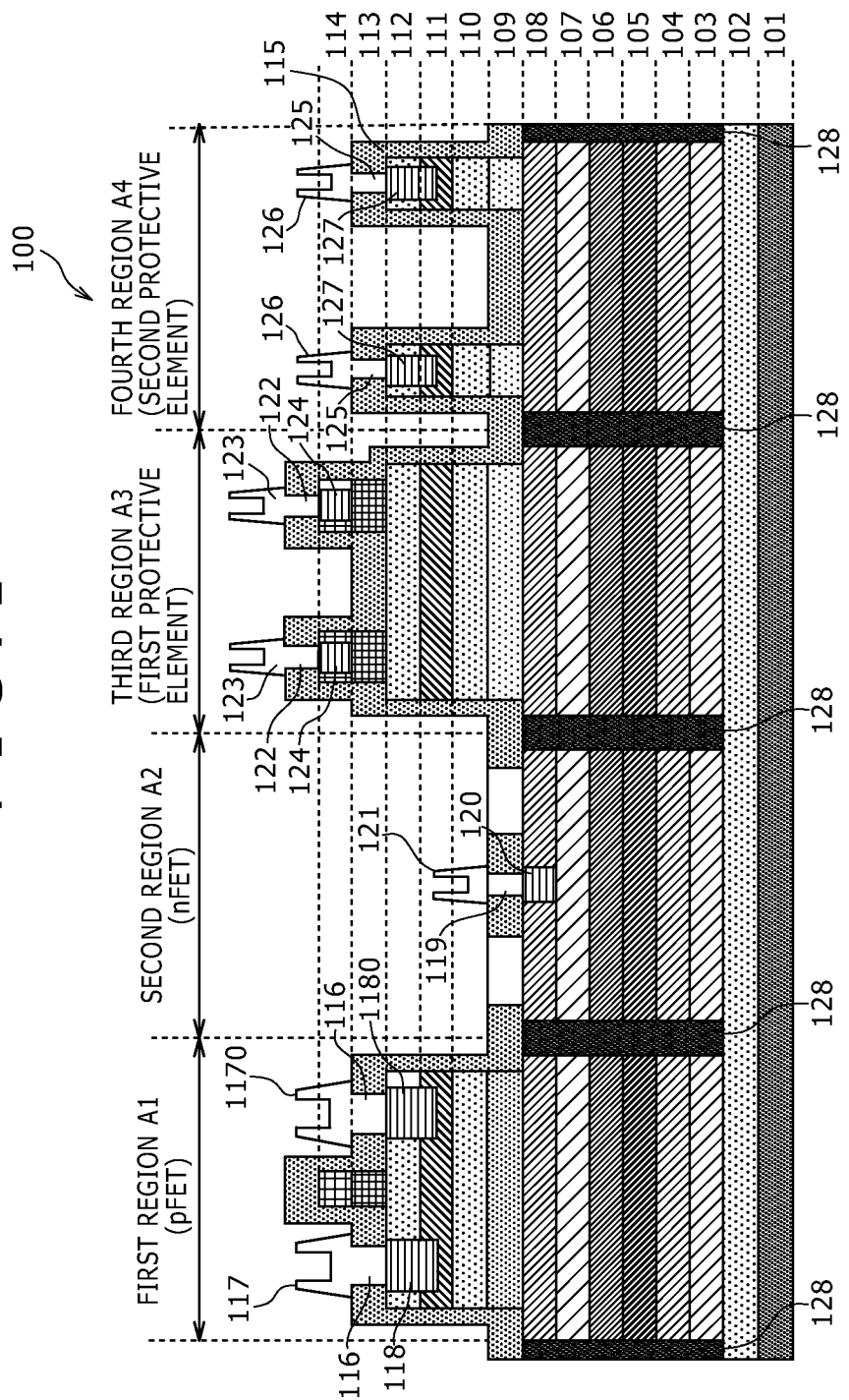
FIG. 1 is a schematic sectional view of a semiconductor device according to a first embodiment.

The present technique will be described below in the following order.
(A) Modes of Present Technique
(B) First Embodiment
(C) Second Embodiment
(D) Other Embodiments
(E) Summarization (A) Modes of Present Technique One of modes of a semiconductor device according to the present technique includes: an epitaxial substrate formed by stacking a plurality of kinds of semiconductors over one semiconductor substrate by epitaxial growth; a field effect transistor of a first conductivity type formed in a first region of the epitaxial substrate by utilizing a stacking structure of the epitaxial substrate; a field effect transistor of a second conductivity type formed in a second region different from the first region of the epitaxial substrate by utilizing a stacking structure of the epitaxial substrate; and a protective element formed in a third region different from the first region and the second region of the epitaxial substrate by utilizing a stacking structure of the epitaxial substrate. The protective element includes: a first stacking structure formed by etching the epitaxial substrate by vertical etching that proceeds in a stacking thickness direction; and a second stacking structure formed by etching the epitaxial substrate by vertical etching that proceeds in a stacking thickness direction. The protective element has two PN junctions on a current path formed between an upper end of the first stacking structure and an upper end of the second stacking structure via a base part of the first stacking structure and the second stacking structure.

In this configuration, the field effect transistor of the first conductivity type, the field effect transistor of the second conductivity type, and the protective element can be formed over the same epitaxial substrate. Thus, the protective element can be formed over the epitaxial substrate configured to form the field effect transistor of the first conductivity type and the field effect transistor of the second conductivity type without any additional step.

In the above-described configuration, the respective elements are formed by using the epitaxial substrate. Therefore, a heterojunction can be easily introduced in the field effect transistor of the first conductivity type, the field effect transistor of the second conductivity type, and the protective element, and it is possible to increase withstand voltages of the field effect transistor of the first conductivity type, the field effect transistor of the second conductivity type, and the protective element.

In the above-described configuration, the protective element is formed by using the epitaxial substrate. Thus, the protective element can be formed by using layers arbitrarily selected from plural epitaxial layers and the flexibility of the structure of the protective element is high. Therefore, the protective element having various characteristics can be arbitrarily designed. It is also possible to simultaneously form plural protective elements having characteristics different from each other over the same epitaxial substrate.

In the above-described configuration, the protective element is three-dimensionally formed by the first stacking structure and the second stacking structure. Therefore, the occupancy area of the protective element in the semiconductor substrate can be reduced.

The first stacking structure and the second stacking structure are formed by etching of the epitaxial substrate as described above. Therefore, introduction of a heterojunction to the protective element is facilitated by appropriately introducing the heterojunction at the stage of the epitaxial growth over the epitaxial substrate in advance and utilizing it for the first stacking structure and the second stacking structure. The junction order of the P-type semiconductor layer and the N-type semiconductor layer in the protective element can also be selected greatly easily.

In one of selective modes of the semiconductor device according to the present technique, the protective element includes one of an N-type semiconductor layer and a P-type semiconductor layer stacked in the epitaxial substrate.

That is, a high-performance protective element can be formed because the protective element is formed by utilizing epitaxial layers such as the N-type semiconductor layer and the P-type semiconductor layer that have been stacked in the epitaxial substrate and are formed with an even impurity concentration.

In one of selective modes of the semiconductor device according to the present technique, the protective element includes a P-type semiconductor layer and an N-type semiconductor layer that are stacked in the epitaxial substrate and an i-type semiconductor layer stacked between the P-type semiconductor layer and the N-type semiconductor layer.

That is, because the protective element is formed by utilizing an i-type layer (semiconductor layer of an intrinsic semiconductor) that has been stacked in the epitaxial substrate, introduction of a heterojunction to the protective element is facilitated and a high-performance protective element can be formed.

As a selective mode of the semiconductor device according to the present technique, a configuration including a junction of a P-N-P-N-P type, a configuration including a junction of a P-N-i-P-i-N-P type, or a configuration including a junction of a P-i-N-i-P type can be arbitrarily selected as the configuration of the protective element.

As above, according to an embodiment of the present technique, the kind of junction can be freely selected and the performance of the protective element included in the semiconductor device can be arbitrarily designed. It is also possible to form plural protective elements with different performances over one semiconductor device to provide the semiconductor device capable of selectively utilizing the protective element having the desired performance.

In one of selective modes of the semiconductor device according to the present technique, the epitaxial substrate includes a heterojunction.

Specifically, a heterojunction can be easily introduced according to another embodiment of the present technique. Introducing a heterojunction can enhance the performance of the field effect transistor of the first conductivity type, the field effect transistor of the second conductivity type, and the protective element formed by using the same epitaxial substrate.

In one of selective modes of the semiconductor device according to the present technique, the epitaxial substrate includes a heterojunction formed by disposing an $Al_{1-x}Ga_xAs$ layer (x=0.1 to 0.5) between two GaAs layers.

In one of selective modes of the semiconductor device according to the present technique, the epitaxial substrate includes a heterojunction formed by disposing an $In_{1-x}Ga_xP$ layer (x=0.51) between two GaAs layers.

In one of selective modes of the semiconductor device according to the present technique, the epitaxial substrate includes a heterojunction formed by disposing an $Al_{1-x}Ga_xAs$ layer (x=0.1 to 0.5) and an $In_{1-x}Ga_xP$ layer (x=0.51) between two GaAs layers.

In one of selective modes of the semiconductor device according to the present technique, the upper end of the first stacking structure and the upper end of the second stacking structure are terminated by a P-type region formed by diffusion of a P-type impurity. As above, it is also possible to form the upper end of the stacking structure by impurity diffusion.

In one of selective modes of the semiconductor device according to the present technique, the epitaxial substrate is formed by sequentially stacking, by epitaxial growth, the stacking structure used to form the field effect transistor of the first conductivity type and the stacking structure used to form the field effect transistor of the second conductivity type over one compound semiconductor substrate.

Specifically, the protective element according to a further embodiment of the present technique can be formed by using the epitaxial layers formed to form the field effect transistor of the first conductivity type and the field effect transistor of the second conductivity type. Thus, in forming the field effect transistor of the first conductivity type and the field effect transistor of the second conductivity type, the protective element can be formed over the same epitaxial substrate without adding a new step.

One of modes of a protective element according to the present technique includes: an epitaxial substrate formed by stacking a plurality of kinds of semiconductors by epitaxial growth; a first stacking structure formed by etching the epitaxial substrate by vertical etching that proceeds in a stacking thickness direction; and a second stacking structure formed by etching the epitaxial substrate by vertical etching that proceeds in a stacking thickness direction. Two PN junctions exist on a current path formed between the upper end of the first stacking structure and the upper end of the second stacking structure via a base part of the first stacking structure and the second stacking structure.

The above-described semiconductor device and protective element encompass various kinds of modes such as being implemented in such a state as to be incorporated in another piece of apparatus and being implemented with another method. The present technique can be realized also as a manufacturing method of a semiconductor device and a manufacturing method of a protective element.

(B) First Embodiment

Embodiments of the present technique will be described below with reference to the drawings.

FIG. 1 is a schematic longitudinal sectional view of a semiconductor device 100 according to a first embodiment of the present technique. The first embodiment will be explained by taking as an example a compound semiconductor device having a compound semiconductor layer of GaAs, which is a III-V compound, as the semiconductor device 100.

The semiconductor device 100 is formed by sequentially stacking, by epitaxial growth, layers 102 to 108 that are epitaxial layers configured to form an N-channel field effect transistor (nFET) and layers 109 to 114 that are epitaxial layers configured to form a P-channel field effect transistor (pFET) over a compound semiconductor substrate 101 of a GaAs single-crystal substrate.

The semiconductor device 100 has a first region A1 in which the pFET is formed, a second region A2 in which the nFET is formed, a third region A3 in which a first protective element is formed, and a fourth region A4 in which a second protective element is formed. The first protective element and the second protective element can be arbitrarily used to protect the pFET and/or the nFET from an overcurrent such as a surge.

The first region A1 to the fourth region A4 are formed over the same compound semiconductor substrate by performing processing (etching, doping, etc.) for the laminar epitaxial substrate formed on the compound semiconductor substrate 101 by epitaxial growth in an appropriate procedure.

The respective layers in the respective regions will be sequentially described below.

First, the second region A2, in which the nFET is formed, will be described.

In the second region A2, the first buffer layer 102, the first electron supplying layer 103, the high resistance layer 104, the first channel layer 105, the high resistance layer 106, the second electron supplying layer 107, and the high resistance layer 108 are sequentially formed and stacked over the compound semiconductor substrate 101.

The first buffer layer 102 is a semiconductor layer inserted between the compound semiconductor substrate 101 and the first electron supplying layer 103 in order to buffer a lattice constant difference between the two layers. For example, a non-doped i-GaAs layer, to which no impurity is added, is used as the first buffer layer 102.

The first electron supplying layer 103 is a semiconductor layer configured to supply electrons to the first channel layer 105. For example, an n$^+$AlGaAs layer that is doped with Si as an n-type impurity at a high concentration of $1.0 \times 10^{12}$ to $4.0 \times 10^{12}$ atoms/cm$^3$ and has a thickness of about 3 nm is used as the first electron supplying layer 103.

The high resistance layer 104 is a semiconductor layer configured to form a favorable heterojunction interface between the first electron supplying layer 103 and the first channel layer 105 formed over it. For example, an i-AlGaAs layer that is doped with no impurity and has a thickness of about 3 nm is used as the high resistance layer 104.

The first channel layer 105 is a semiconductor layer in which a main current of the nFET flows. For example, an i-InGaAs layer that is doped with no impurity and has a thickness of about 5 nm to 15 nm is used as the first channel layer 105.

The high resistance layer 106 is a semiconductor layer configured to form a favorable heterojunction interface between the first channel layer 105 and the second electron supplying layer 107 formed over it. For example, an i-AlGaAs layer that is doped with no impurity and has a thickness of about 3 nm is used as the high resistance layer 106.

The second electron supplying layer 107 is a semiconductor layer configured to supply electrons to the first channel layer 105. For example, an n$^+$AlGaAs layer that is doped with Si as an n-type impurity at a high concentration of $1.0 \times 10^{12}$ to $4.0 \times 10^{12}$ atoms/cm$^3$ and has a thickness of about 6 nm is used as the second electron supplying layer 107.

The high resistance layer 108 is a semiconductor layer configured to form a favorable heterojunction interface with the cap layer 109 formed on the high resistance layer 108 in the first region A1, the third region A3, and the fourth region A4. For example, an n$^-$AlGaAs layer that is doped with Si as an n-type impurity at a low concentration of $1.0 \times 10^{10}$ to $4.0 \times 10^{11}$ atoms/cm$^3$ and has a thickness of about 70 nm to 200 nm is used as the high resistance layer 108. In the second region A2, a p-type gate region 120 is formed in the high resistance layer 108 by diffusing Zn as a p-type impurity.

In the second region A2, an insulating film 115 formed of a silicon nitride film is formed on an upper surface of the high resistance layer 108. An aperture 119 configured to connect the external of the semiconductor device 100 to the high resistance layer 108 is formed in the insulating film 115 and a gate electrode 121 is formed in the aperture 119.

The gate electrode 121 includes e.g. a metal electrode obtained by sequentially stacking titanium (Ti), platinum (Pt), and gold (Au) and an ohmic contact is made with the p-type gate region 120 formed under the gate electrode 121. Although not shown in FIG. 1, a source electrode and a drain electrode are formed on both sides of the gate electrode 121. They penetrate the insulating film 115 and ohmic contacts are made with the high resistance layer 108.

Next, the first region A1, in which the pFET is formed, will be described below.

In the first region A1, the cap layer 109, the second buffer layer 110, the second channel layer 111, the gate leak prevention layer 112, the n-type first gate layer 113, and the n-type second gate layer 114 are sequentially formed and stacked over the stacking structure of the respective layers 102 to 108 used for the second region A2.

The cap layer 109 is formed on the high resistance layer 108 and an n$^+$GaAs layer containing an n-type impurity such as Si at a concentration of $6 \times 10^{18}$ atoms/cm$^3$ is used as the cap layer 109 for example.

The second buffer layer 110 is a semiconductor layer inserted between the cap layer 109 and the second channel layer 111 in order to buffer the lattice constant difference between the two layers. For example, an i-GaAs layer that is doped with no impurity and has a thickness of 10 nm to 100 nm is used as the second buffer layer 110.

The second channel layer 111 is formed on the second buffer layer 110 and is e.g. a p$^-$GaAs layer that is doped with a p-type impurity such as carbon (C) at a concentration of $1 \times 10^{16}$ to $5 \times 10^{18}$ atoms/cm$^3$ and has a thickness of 30 nm to 250 nm.

The gate leak prevention layer 112 is formed on the second channel layer 111 and is e.g. an i-AlGaAs layer that is doped with no impurity and has a thickness of 0 nm to 50 nm.

On the gate leak prevention layer 112, an n-type gate layer having a small width compared with the width of the respective layers 109 to 112 formed on the stacking structure of the respective layers 102 to 108 in the first region A1 is stacked. This n-type gate layer has a two-layer structure including the n-type first gate layer 113 and the n-type second gate layer 114.

The n-type first gate layer 113 includes e.g. n$^-$InGaP that is doped with an n-type impurity such as Si at a concentration of $1 \times 10^{17}$ to $5 \times 10^{19}$ atoms/cm$^3$ and has a thickness of 10 nm to 50 nm.

The n-type second gate layer 114 includes e.g. n$^-$GaAs that is doped with an n-type impurity such as Si at a concentration of $1 \times 10^{17}$ to $5 \times 10^{19}$ atoms/cm$^3$ and has a thickness of 50 nm to 200 nm.

The insulating film 115 formed of the silicon nitride film is formed on side surfaces of the second buffer layer 110, the second channel layer 111, the gate leak prevention layer 112, and the n-type gate layer and on upper surfaces of the gate leak prevention layer 112 and the n-type gate layer.

In the insulating film 115 formed on the upper surface of the gate leak prevention layer 112, apertures 116 are formed at positions separated from each other on both sides of the n-type gate layer stacked on the gate leak prevention layer 112. A source electrode 117 and a drain electrode 1170 composed of a metal are formed in these apertures 116.

The source electrode 117 and the drain electrode 1170 each have a metal electrode obtained by sequentially stacking titanium (Ti), platinum (Pt), and gold (Au) and ohmic contacts are made with a source region 118 and a drain region 1180, respectively, formed under them.

The source region 118 and the drain region 1180 are diffusion regions formed by diffusing Zn as an impurity from the apertures 116 into the gate leak prevention layer 112 to turn the gate leak prevention layer 112 and partial regions of the second channel layer 111 to p-type regions. That is, the source region 118 and the drain region 1180 are so formed as to penetrate the gate leak prevention layer 112 and extend to the partial regions of the second channel layer 111.

In a boundary region between the first region A1 and the second region A2, an element isolation region 128 is so formed as to penetrate the respective layers 103 to 108. The element isolation region 128 is formed by ion implantation of boron (B) for example.

As described above, the pFET having a pn junction gate is formed in the first region A1 and the nFET having a pn junction gate is formed in the second region A2. Therefore, both FETs, particularly the pFET, can be operated in an enhanced mode and high-speed operation complementary FETs with a reduced leakage current are formed over the same substrate.

Next, the third region A3, in which the first protective element is formed, will be described below.

The layer structure in the third region A3 is formed by sequentially making a stacking structure similar to that of the first region A1 on the stacking structure of the respective layers 102 to 108 used to form the nFET in the second region A2, similarly to the first region A1. The compositions of the respective layers in the third region A3 are the same as those in the above-described first region A1 and second region A2 because the layer structure in the third region A3 is formed by using the same epitaxial substrate as that of the nFET and the pFET.

In the third region A3, two n-type gate layers having a small width compared with the width of the respective layers 109 to 112 formed on the stacking structure of the respective layers 102 to 108 in this third region A3 are so stacked as to be separated from each other. These n-type gate layers have a two-layer structure including the n-type first gate layer 113 and the n-type second gate layer 114 similarly to the above-described first region A1.

In the third region A3, the insulating film 115 formed of the silicon nitride film is formed on the side surfaces of the second buffer layer 110, the second channel layer 111, the gate leak prevention layer 112, and the n-type gate layers and on the upper surfaces of the gate leak prevention layer 112 and the n-type gate layers.

Apertures 122 are formed in the insulating film 115 formed on the upper surface of the n-type gate layers. Anode electrodes 123 composed of a metal are formed in these apertures 122 and ohmic contacts are made with p-type semiconductor regions 124 formed under the anode electrodes 123.

The p-type semiconductor regions 124 are diffusion regions formed by diffusing Zn as an impurity from the apertures 122 into the gate leak prevention layer 112 to turn partial regions of the n-type second gate layer 114 to p-type regions.

In a boundary region between the second region A2 and the third region A3, the element isolation region 128 is so formed as to penetrate the respective layers 103 to 108. The element isolation region 128 is formed by ion implantation of boron (B) for example.

In the first protective element formed in this manner, the semiconductors connecting the anode electrodes 123 to each other form a junction of a P-N-i-P-i-N-P type (P: P-type semiconductor, N: N-type semiconductor, i: intrinsic semiconductor). However, the thickness of the gate leak prevention layer 112 is zero in some cases as described above. Therefore, the semiconductors between the anode electrodes 123 form a junction of a P-N-P-N-P type in some cases.

As described above, the first protective element is formed in the third region A3 over the same substrate by utilizing the same epitaxial substrate as that of the pFET formed in the first region A1 and the nFET formed in the second region A2. This allows the protective element for the pFET and the nFET to be formed simultaneously with the pFET and the nFET without any additional step.

High-temperature annealing like that described in the above-described Patent Document 2 does not need to be performed. Therefore, a wide variety of element design including the heterojunction is permitted about the pFET and the nFET. A wide variety of element design including the heterojunction is permitted also about the first protective element. This can enhance the performance and withstand voltage of the pFET, the nFET, and the first protective element and can enhance also the performance of other elements formed over the same substrate.

Because the first protective element is formed by using the epitaxial substrate, the impurity concentration of the n-type region used for the first protective element is even.

Because the design of the first protective element is three-dimensional, the range of element design is expanded.

Next, the fourth region A4, in which the second protective element is formed, will be described below.

The fourth region A4 is formed by stacking the P-type epitaxial layers (layers 109 to 114) used to form the first region A1 over the N-type epitaxial layers (layers 102 to 108) used to form the second region A2. The respective layers in the fourth region A4 are formed by using the same epitaxial substrate as that of the above-described nFET and pFET. Therefore, the compositions of the respective layers are the same as those in the above-described first region A1 and second region A2.

On the high resistance layer 108 in the fourth region A4, two stacking structures (first stacking structure and second stacking structure) whose width is smaller than that of the respective layers 102 to 108 in the fourth region A4 are formed. The first stacking structure and the second stacking structure are portions isolated from the periphery by vertical etching of part of the respective layers 109 to 112.

In the fourth region A4, the insulating film 115 formed of the silicon nitride film is formed on the side surfaces of the second buffer layer 110, the second channel layer 111, and the gate leak prevention layer 112 and on the upper surface of the gate leak prevention layer 112.

Apertures 125 are formed in the insulating film 115 formed on the upper surface of the gate leak prevention layer 112. Anode electrodes 126 composed of a metal are formed in these apertures 125 and ohmic contacts are made with p-type semiconductor regions 127 formed under the anode electrodes 126.

The p-type semiconductor regions 127 are diffusion regions formed by diffusing Zn as an impurity from the apertures 125 into the gate leak prevention layer 112 to turn partial regions of the gate leak prevention layer 112 to p-type regions.

In a boundary region between the third region A3 and the fourth region A4, the element isolation region 128 is so formed as to penetrate the respective layers 103 to 108. The element isolation region 128 is formed by ion implantation of boron (B) for example.

In the second protective element formed in this manner, the semiconductors connecting the anode electrodes 126 to each other form a junction of a P-i-N-i-P type.

As described above, the second protective element is formed in the fourth region A4 over the same substrate by utilizing the same epitaxial substrate as that of the pFET formed in the first region A1 and the nFET formed in the second region A2. This allows the protective element for the pFET and the nFET to be formed simultaneously with the pFET and the nFET without any additional step.

High-temperature annealing like that described in the above-described Patent Document 2 does not need to be performed. Therefore, a wide variety of element design including the heterojunction is permitted about the pFET and the nFET. A wide variety of element design including the heterojunction is permitted also about the second protective element. This can enhance the performance and withstand voltage of the pFET, the nFET, and the second protective element and can enhance also the performance of other elements formed over the same substrate.

Because the second protective element is formed by using the epitaxial substrate, the impurity concentration of the n-type region used for the second protective element is even.

Because the design of the second protective element is three-dimensional, the range of element design is expanded.

Figure 2A:
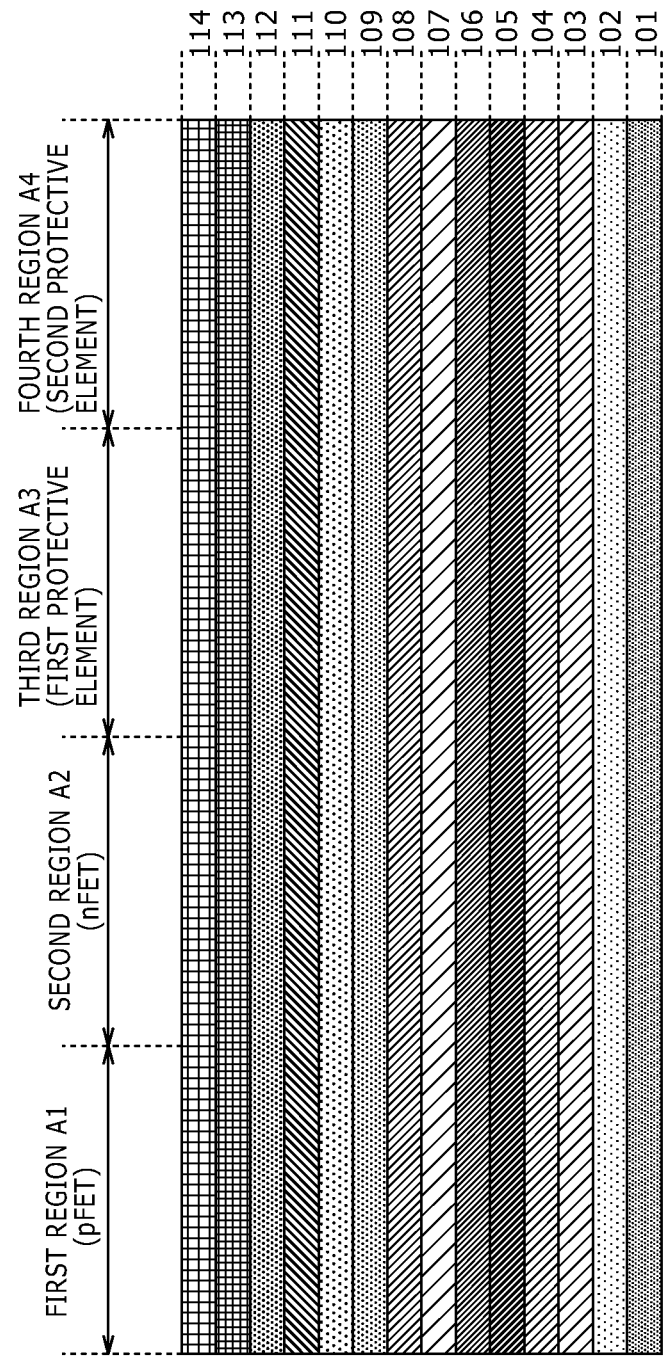
FIG. 2A is a schematic diagram showing a manufacturing step of the semiconductor device according to the first embodiment.

A manufacturing method of the semiconductor device 100 according to the first embodiment will be described below with use of FIGS. 2A to 2I. FIG. 2A is a schematic longitudinal sectional view showing the stacking structure for the semiconductor device 100, obtained by epitaxially growing the respective layers composed mainly of a GaAs material over a GaAs single-crystal substrate by e.g. metal organic chemical vapor deposition (MOCVD).

To form the stacking structure shown in this diagram, first a GaAs layer doped with no impurity is epitaxially grown to form the first buffer layer 102 having a thickness of about 200 nm on the compound semiconductor substrate 101 composed of the GaAs single crystal.

On the first buffer layer 102, an n$^+$AlGaAs layer doped with Si as an n-type impurity at a high concentration of $1.0 \times 10^{12}$ to $4.0 \times 10^{12}$ atoms/cm$^3$, specifically e.g. $3.0 \times 10^{12}$ atoms/cm$^3$, is epitaxially grown to form the first electron supplying layer 103 having a thickness of about 3 nm.

On the first electron supplying layer 103, an i-AlGaAs layer doped with no impurity is epitaxially grown to form the high resistance layer 104 having a thickness of about 3 nm. These first electron supplying layer 103 and high resistance layer 104 configure a first barrier layer. The composition ratio of aluminum (Al) of this first barrier layer is so set that x=0.1 to 0.5 holds in the composition formula defined as $Al_{1-x}Ga_xAs$. For example, the composition ratio is set to $Al_{0.2}Ga_{0.8}As$.

On the high resistance layer 104, an i-InGaAs layer doped with no impurity is epitaxially grown to form the first channel layer 105 having a thickness of 5 nm to 15 nm. The composition ratio of indium (In) of the first channel layer 105 is so set that x=0.51 holds in the composition formula defined as $In_{1-x}Ga_xAs$, so that a band gap is set narrower than that of the above-described first barrier layer.

On the first channel layer 105, an i-AlGaAs layer doped with no impurity is epitaxially grown to form the high resistance layer 106 having a thickness of about 2 nm.

On the high resistance layer 106, an n$^+$AlGaAs layer doped with Si as an n-type impurity at a high concentration of $1.0 \times 10^{12}$ to $4.0 \times 10^{12}$ atoms/cm$^3$ is epitaxially grown to form the second electron supplying layer 107 having a thickness of about 6 nm.

On the second electron supplying layer 107, an n AlGaAs layer doped with Si as an n-type impurity at a low concentration is epitaxially grown to form the high resistance layer 108 having a thickness of 70 nm to 200 nm.

These high resistance layer 106, second electron supplying layer 107, and high resistance layer 108 configure a second barrier layer. The composition ratio of aluminum (Al) of this second barrier layer is so set that x=0.1 to 0.5 holds in the composition formula defined as $Al_{1-x}Ga_xAs$. For example, the composition ratio is set to $Al_{0.2}Ga_{0.8}As$. This can widen the band gap of the second barrier layer compared with the first channel layer 105.

On the high resistance layer 108, an n$^+$GaAs film doped with an n-type impurity at $6 \times 10^{18}$ atoms/cm$^3$ is epitaxially grown to form the cap layer 109.

An i-GaAs layer doped with no impurity is then epitaxially grown to form the second buffer layer 110 having a thickness of 10 nm to 100 nm.

On the second buffer layer 110, a p$^-$GaAs layer doped with a p-type impurity such as C at a concentration of $1 \times 10^{16}$ to $5 \times 10^{18}$ atoms/cm$^3$ is epitaxially grown to form the second channel layer 111 having a thickness of 30 nm to 250 nm.

On the second channel layer 111, an i-AlGaAs layer doped with no impurity is epitaxially grown to form the gate leak prevention layer 112 having a thickness of 0 to 50 nm. The reason why the lower limit of the thickness is zero is because the gate leak prevention layer 112 is not an essential component. The composition ratio of aluminum (Al) of the gate leak prevention layer 112 is so set that x=0.1 to 0.5 holds in the composition formula defined as $Al_{1-x}Ga_xAs$. For example, the composition ratio is set to $Al_{0.2}Ga_{0.8}As$.

On the gate leak prevention layer 112 or the second channel layer 111, an n$^-$InGaP layer doped with an n-type impurity such as Si at a concentration of $1 \times 10^{17}$ to $5 \times 10^{19}$ atoms/cm$^3$ is epitaxially grown to form the n-type first gate layer 113 having a thickness of 10 nm to 50 nm.

On the n-type first gate layer 113, an n$^-$GaAs layer doped with an n-type impurity such as Si at a concentration of $1 \times 10^{17}$ to $5 \times 10^{19}$ atoms/cm$^3$ is epitaxially grown to form the n-type second gate layer 114 having a thickness of 50 nm to 200 nm. The n-type first gate layer 113 and the n-type second gate layer 114 configure the n-type gate layer.

The above-described epitaxial growth is performed at a temperature of about 600° C.

Figure 2B:
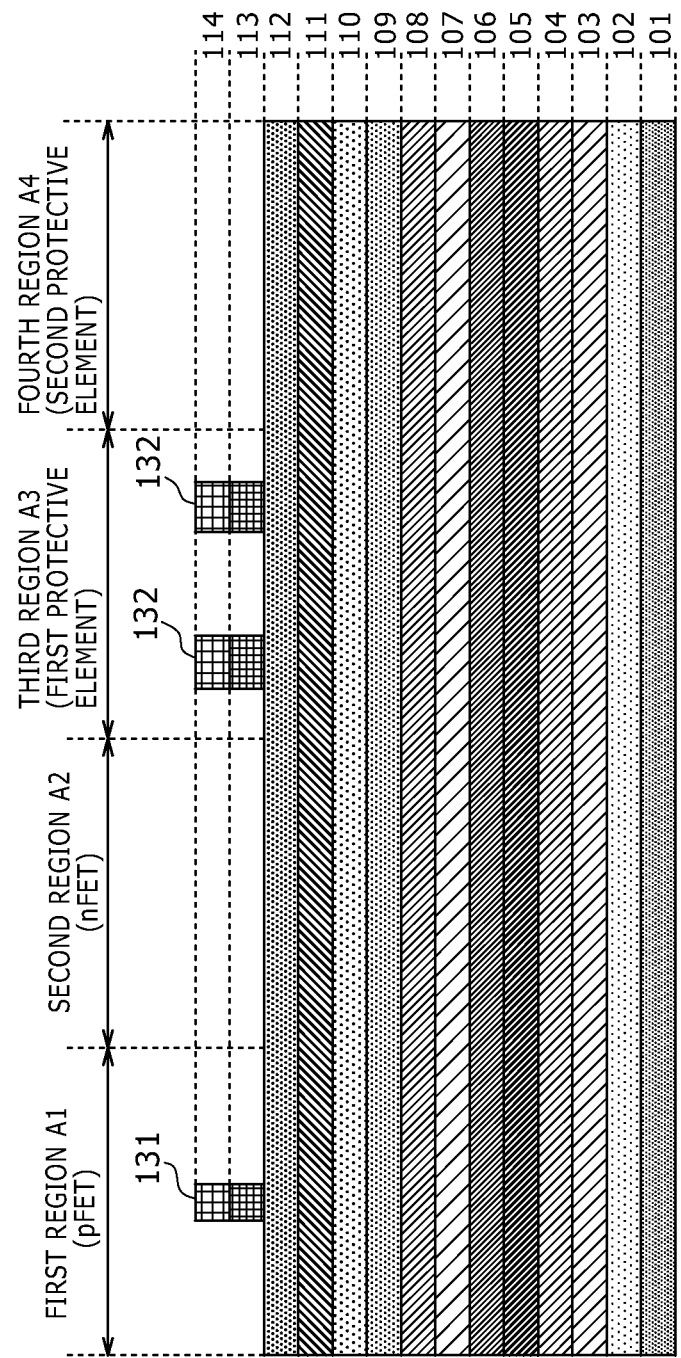
FIG. 2B is a schematic diagram showing the manufacturing step of the semiconductor device according to the first embodiment.

As shown in FIG. 2B, the n-type second gate layer 114 and the n-type first gate layer 113 are sequentially etching-removed selectively by using e.g. a photolithography technique and a wet etching or dry etching technique.

By this etching, an n-type gate region 131 is formed in the first region A1 and stacking structures 132 of the protective element (protective diode) are formed in the third region A3.

As shown in FIG. 2C, the gate leak prevention layer 112, the second channel layer 111, the second buffer layer 110, and the cap layer 109 are sequentially etching-removed selectively by using e.g. the photolithography technique and the wet etching or dry etching technique.

By this etching, in the first region A1, a state in which the respective layers 109 to 112 remain without being removed and the n-type gate region 131 is stacked over the respective layers 109 to 112 is obtained. In the second region A2, a state in which all of the respective layers 109 to 114 are etching-removed is obtained. In the third region A3, a state in which the respective layers 109 to 112 remain without being removed and the above-described stacking structures 132 are stacked and remain over the respective layers 109 to 112 is obtained. In the fourth region A4, the respective layers 109 to 112 are partially etched and two stacking structures formed of the remaining part of the respective layers 109 to 112, which is not partially etched, are obtained as stacking structures 133. These stacking structures 133 have a width smaller than that of the fourth region A4 and the width of each of the stacking structures 133 is smaller than half the width of the fourth region A4.

As shown in FIG. 2D, the insulating film 115 formed of the silicon nitride film is then formed to have a thickness of 100 nm to 500 nm on an exposed surface of a substrate upper surface by a plasma CVD method.

As shown in FIG. 2E, the following apertures are then formed in the insulating film 115: the apertures 116 configured to form the source region 118 and the drain region 1180 in the first region A1; the aperture 119 configured to form the p-type gate region 120 in the second region A2; the apertures 122 configured to form the p-type semiconductor regions 124 in the third region A3; and the apertures 125 configured to form the p-type semiconductor regions 127 in the fourth region A4.

The apertures 116, 119, 122, and 125 are formed by the photolithography technique and anisotropic etching using e.g. a reactive ion etching (RIE) technique.

As shown in FIG. 2F, Zn as an impurity is diffused through the apertures 116 in the insulating film 115 to the gate leak prevention layer 112 and a midway part of the second channel layer 111 in its thickness direction. The Zn is diffused through the aperture 119 to a midway part of the high resistance layer 108 in its thickness direction. The Zn is diffused through the apertures 122 to a midway part of the n-type second gate layer 114 in its thickness direction, and is diffused through the apertures 125 to the gate leak prevention layer 112 and a midway part of the second channel layer 111 in its thickness direction.

Thereby, the p-type source region 118 and drain region 1180 are formed in the first region A1 and the p-type gate region 120 is formed in the second region A2. The p-type semiconductor regions 124 are formed in the third region A3 and the p-type semiconductor regions 127 are formed in the fourth region A4.

The Zn is introduced and diffused from the apertures 116, 119, 122, and 125 by heating the substrate to about 600° C. in a gas atmosphere containing diethyl zinc ($Zn(C_2H_5)_2$) and arsine ($AsH_3$).

In the second region A2, it is preferable that the p-type gate region 120 be so formed that a deepest reach point of the Zn diffused from the aperture 119 is separate from an upper surface of the first channel layer 105 by about 10 nm or longer. It is also possible to implant Zn by an ion implantation method.

As shown in FIG. 2G, the element isolation regions 128 configured to electrically isolate the first region A1 to the fourth region A4 are then formed. The element isolation regions 128 are formed from a level of the high resistance layer 108 to a depth reaching the bottom of the first electron supplying layer 103. The element isolation regions 128 can be formed by an ion implantation method of B ions for example.

As shown in FIG. 2H, a metal film is then deposited on the substrate surface and is selectively removed by using the photolithography technique and etching technique to simultaneously form the source electrode 117 and the drain electrode 1170 in the first region A1, the gate electrode 121 in the second region A2, the anode electrodes 123 in the third region A3, and the anode electrodes 126 in the fourth region A4.

The metal film is formed by depositing titanium (Ti), platinum (Pt), and gold (Au) to thicknesses of e.g. 30 nm, 50 nm, and 120 nm, respectively, by e.g. an electron beam evaporation method. This can make an ohmic contact with each of the p-type source region 118 and drain region 1180, the p-type gate region 120, the p-type semiconductor regions 124, and the p-type semiconductor regions 127, which are formed by diffusing Zn.

As shown in FIG. 2I, a protective film 140 composed of an insulating material is then deposited on the substrate surface. Subsequently, apertures 129 are formed in the protective film 140 and the insulating film 115 in such a manner as to sandwich the gate electrode 121 in the second region A2.

Then, a gold-germanium (AuGe) alloy is deposited to a thickness of about 160 nm and nickel (Ni) is deposited to a thickness of about 40 nm on the substrate surface by a resistance heating method and the deposited metals are selectively removed by using the photolithography technique and etching technique to form a source electrode 130 and a drain electrode 1300. For the source electrode 130 and the drain electrode 1300, ohmic contacts are made with the n-type high resistance layer 108.

A gate electrode in the first region A1 can be formed simultaneously with the source electrode 130 and the drain electrode 1300 in the second region A2 by simultaneously forming an aperture also above the n-type gate region 131 in the first region A1 when the apertures 129 are formed in the protective film 140 and the insulating film 115.

According to the above-described manufacturing method, the pFET, the nFET, the first protective element, and the second protective element having the structure shown in FIG. 1 can be simultaneously formed over the same epitaxial substrate.

Figure 3:
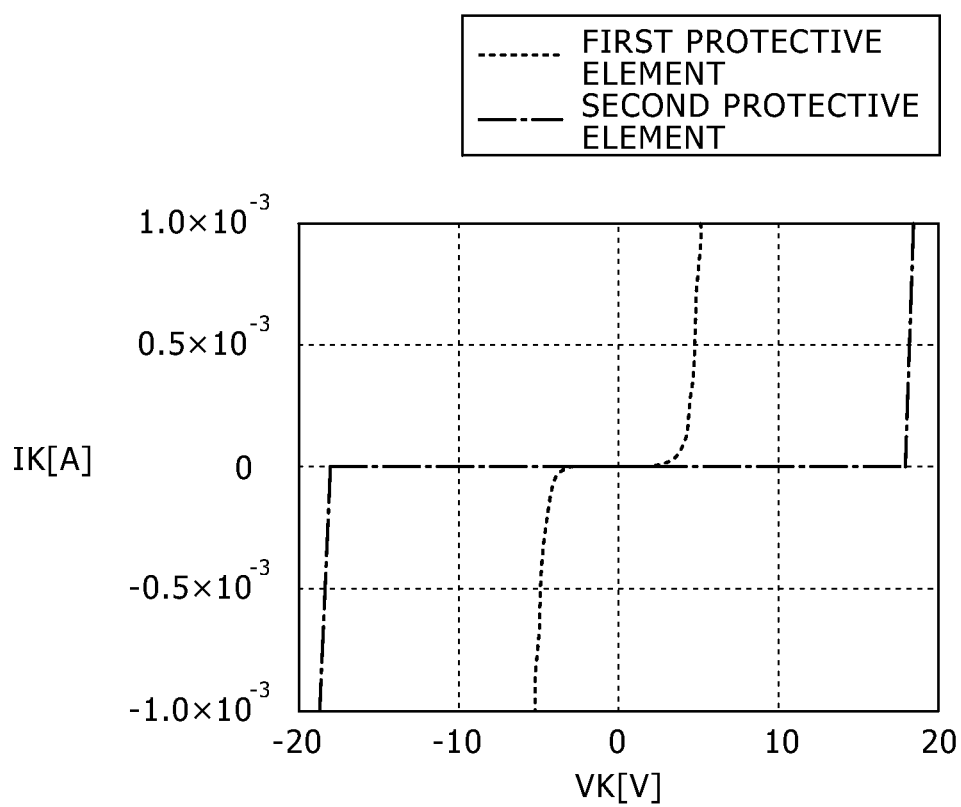
FIG. 3 is a diagram showing the direct-current (DC) characteristics of the semiconductor device according to the first embodiment.

FIG. 3 shows DC characteristics of the first protective element and the second protective element in the semiconductor device 100 according to the first embodiment. In this diagram, a chain line shows DC characteristics of the first protective element and a two-dot chain line shows DC characteristics of the second protective element.

As shown in this diagram, both the first protective element and the second protective element show a PNP characteristic and particularly the first protective element has a high withstand voltage. In this manner, the first protective element and the second protective element show completely different withstand voltage characteristics. Thus, the protective element having the necessary withstand voltage characteristic can be arbitrarily selected and utilized depending on the operation environment, use condition, design, etc.

(C) Second Embodiment

Figure 4:
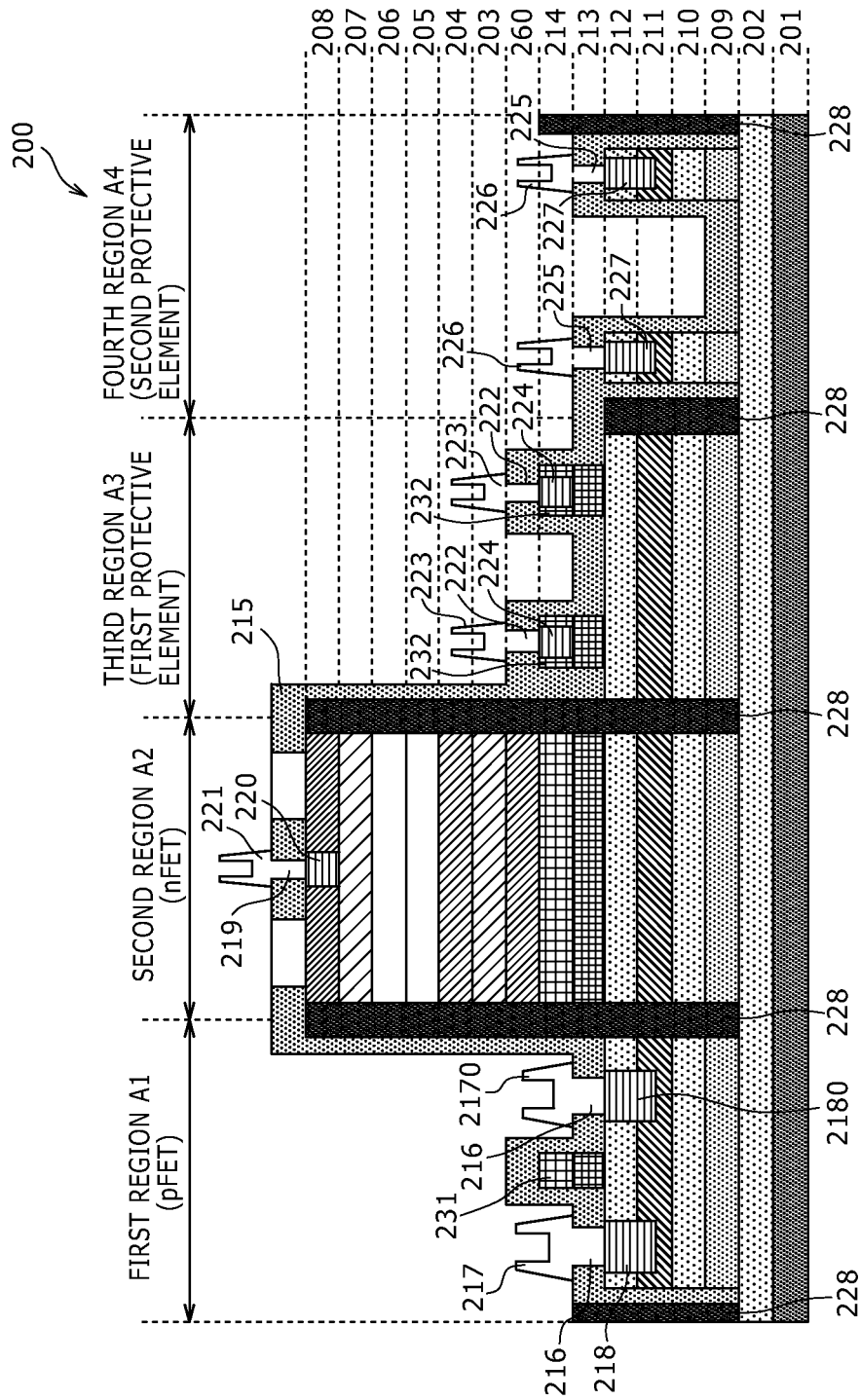
FIG. 4 is a schematic sectional view of a semiconductor device according to a second embodiment.

FIG. 4 is a schematic longitudinal sectional view of a semiconductor device 200 according to a second embodiment of the present technique. In the semiconductor device 200, the same part or the part having the same function as a part given a numeral "1xx" in the above-described semiconductor device 100 is given a numeral "2xx" in which the numbers of "xx" are the same.

The semiconductor device 200 is formed by sequentially stacking, by epitaxial growth, P-type epitaxial layers configured to form a pFET and N-type epitaxial layers configured to form an nFET over a compound semiconductor substrate 201 of a GaAs single-crystal substrate. That is, in the semiconductor device 200, the stacking order of the epitaxial layers configured to form the pFET and the epitaxial layers configured to form the nFET is vertically reversed from that of the above-described first embodiment.

Similarly to the above-described first embodiment, the semiconductor device 200 has the first region A1 in which the pFET is formed, the second region A2 in which the nFET is formed, the third region A3 in which a first protective element is formed, and the fourth region A4 in which a second protective element is formed.

Configurations of the respective regions will be sequentially described below.

In the first region A1, a first buffer layer 202, a cap layer 209, a second buffer layer 210, a second channel layer 211, a gate leak prevention layer 212, an n-type first gate layer 213, and an n-type second gate layer 214 are sequentially formed and stacked over the compound semiconductor substrate 201.

In the second region A2, a high resistance layer 260, a first electron supplying layer 203, a high resistance layer 204, a first channel layer 205, a high resistance layer 206, a second electron supplying layer 207, and a high resistance layer 208 are sequentially formed and stacked over the stacking structure of the respective layers 209 to 214 used for the first region A1.

The high resistance layer 260 is a semiconductor layer configured to form a favorable heterojunction interface between the n-type second gate layer 214 and the first electron supplying layer 203 formed over it. For example, an i-AlGaAs layer that is doped with no impurity and has a thickness of about 3 nm is used as the high resistance layer 260.

Element isolation regions 228 are so formed as to penetrate the respective layers 209 to 214, 260, and 203 to 208 in a boundary region between the first region A1 and the second region A2 and a boundary region between the second region A2 and the third region A3. The element isolation region 228 is so formed as to penetrate the respective layers 209 to 212 in a boundary region between the third region A3 and the fourth region A4.

The element isolation region 228 is formed also on a surface of an insulating film 215 formed on a side surface of the first region A1. The element isolation region 228 is formed also on a side surface of the second region A2, i.e. on side surfaces of the respective layers 209 to 214, 260, and 203 to 208. The insulating film 215 is formed also on an exposed surface of the element isolation region 228 formed in the boundary region between the first region A1 and the second region A2.

The film thicknesses of the respective layers and the impurity materials and impurity concentrations of the layers doped with an impurity are the same as those of the corresponding components in the semiconductor device 100 of the first embodiment.

As described above, the pFET having a pn junction gate is formed in the first region A1 and the nFET having a pn junction gate is formed in the second region A2. Therefore, both FETs, particularly the pFET, can be operated in an enhanced mode and high-speed operation complementary FETs with a reduced leakage current are formed over the same substrate.

Next, a manufacturing method of the semiconductor device 200 according to the second embodiment will be described below.

The first buffer layer 202 of a GaAs layer is first epitaxially grown on the compound semiconductor substrate 201.

Over the first buffer layer 202, the cap layer 209 of $n^+$GaAs doped with an n-type impurity at a high concentration and the second buffer layer 210 of i-GaAs doped with no impurity are sequentially epitaxially grown.

Over the second buffer layer 210, the second channel layer 211 composed of $p^-$GaAs doped with a p-type impurity and the gate leak prevention layer 212 composed of i-AlGaAs doped with no impurity are sequentially epitaxially grown.

Over the gate leak prevention layer 212, the n-type first gate layer 213 composed of $n^-$InGaP doped with an n-type impurity at a low concentration and the n-type second gate layer 214 composed of $n^-$GaAs doped with an n-type impurity are sequentially epitaxially grown to form an n-type gate layer.

Over the n-type gate layer, the high resistance layer 260 of i-AlGaAs doped with no impurity and a second barrier layer including the first electron supplying layer 203 of $n^+$AlGaAs doped with an n-type impurity at a high concentration and the high resistance layer 204 of i-AlGaAs doped with no impurity are sequentially epitaxially grown.

On the second barrier layer, the first channel layer 205 of i-InGaAs doped with no impurity is epitaxially grown.

Over the first channel layer 205, the high resistance layer 206 of i-AlGaAs doped with no impurity, the second electron supplying layer 207 of $n^+$AlGaAs doped with an n-type impurity at a high concentration, and the high resistance layer 208 of $n^-$AlGaAs doped with an n-type impurity at a low concentration are sequentially epitaxially grown to form a first barrier layer.

In the above description, the film thicknesses of the respective layers and the dopant materials and dopant concentrations of the layers doped with an impurity are the same as those of the corresponding layers in the above-described first embodiment.

The element isolation region 228 is then formed to electrically isolate the first region A1 from the second region A2. Subsequently, the respective layers 209 to 214, 260, and 203 to 208 in the first region A1, the third region A3, and the fourth region A4 are selectively removed.

The n-type first gate layer 213 and the n-type second gate layer 214 in the first region A1 are selectively removed to form an n-type gate region 231 having a stacking structure of the n-type first gate layer 213 and the n-type second gate layer 214. The n-type first gate layer 213 and the n-type second gate layer 214 in the third region A3 are selectively removed to form n-type gate regions 232 having the stacking structure of the n-type first gate layer 213 and the n-type second gate layer 214.

The insulating film 215 formed of a silicon nitride film is then deposited on a surface of the high resistance layer 208, a surface and side surface of the n-type second gate layer 214, a surface of the gate leak prevention layer 212, and surfaces and side surfaces of the element isolation regions 228.

Apertures 216 configured to form a source region 218 and a drain region 2180 in the first region A1, an aperture 219 configured to form a p-type gate region 220 in the second region A2, apertures 222 configured to form p-type semiconductor regions 224 in the third region A3, and apertures 225 configured to form p-type semiconductor regions 227 in the fourth region A4 are formed.

Then, Zn as a p-type impurity is introduced from these apertures 216, 219, 222, and 225 into the gate leak prevention layer 212, the second channel layer 211, the high resistance layer 208, and the n-type second gate layer 214. Thereby, the source region 218 and the drain region 2180 in the first region A1, the p-type gate region 220 in the second region A2, the p-type semiconductor regions 224 in the third region A3, and the p-type semiconductor regions 227 in the fourth region A4 are simultaneously formed.

A metal film is then deposited and selectively removed to simultaneously form a source electrode 217 and a drain electrode 2170 in the first region A1, a gate electrode 221 in the second region A2, anode electrodes 223 in the third region A3, and anode electrodes 226 in the fourth region A4.

A gate electrode in the first region A1 and a source electrode and a drain electrode in the second region A2 can be simultaneously formed similarly to the above-described first embodiment.

The impurity concentrations and film thicknesses of the respective layers formed by epitaxial growth, introduction diffusion of Zn, and the compositions and film thicknesses of the source electrode, the drain electrode, and the gate electrode may be the same as those of the first embodiment.

(D) Other Embodiments

Figure 5:
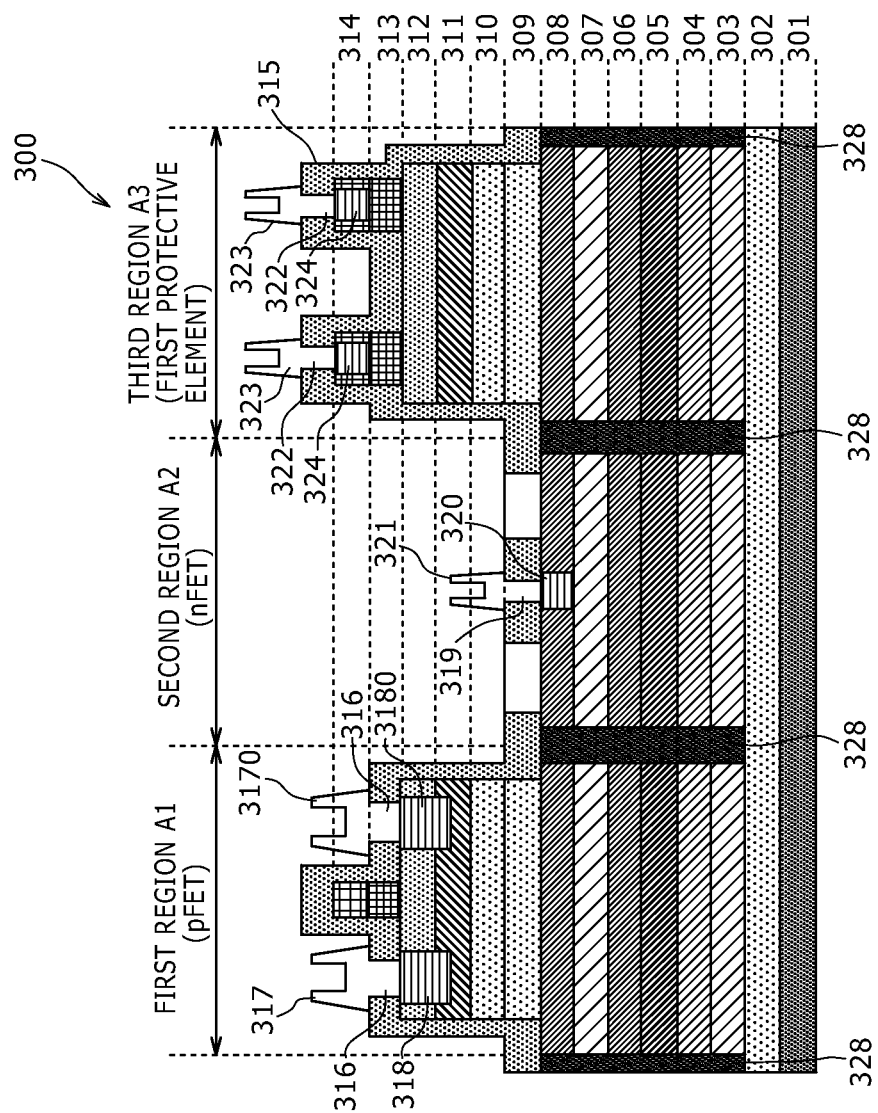
FIG. 5 is a schematic sectional view of a semiconductor device according to a third embodiment.

FIG. 5 is a schematic longitudinal sectional view of a semiconductor device 300 according to a third embodiment of the present technique. In the semiconductor device 300, the same part or the part having the same function as a part given a numeral "1xx" in the above-described semiconductor device 100 is given a numeral "3xx" in which the numbers of "xx" are the same.

Figure 6:
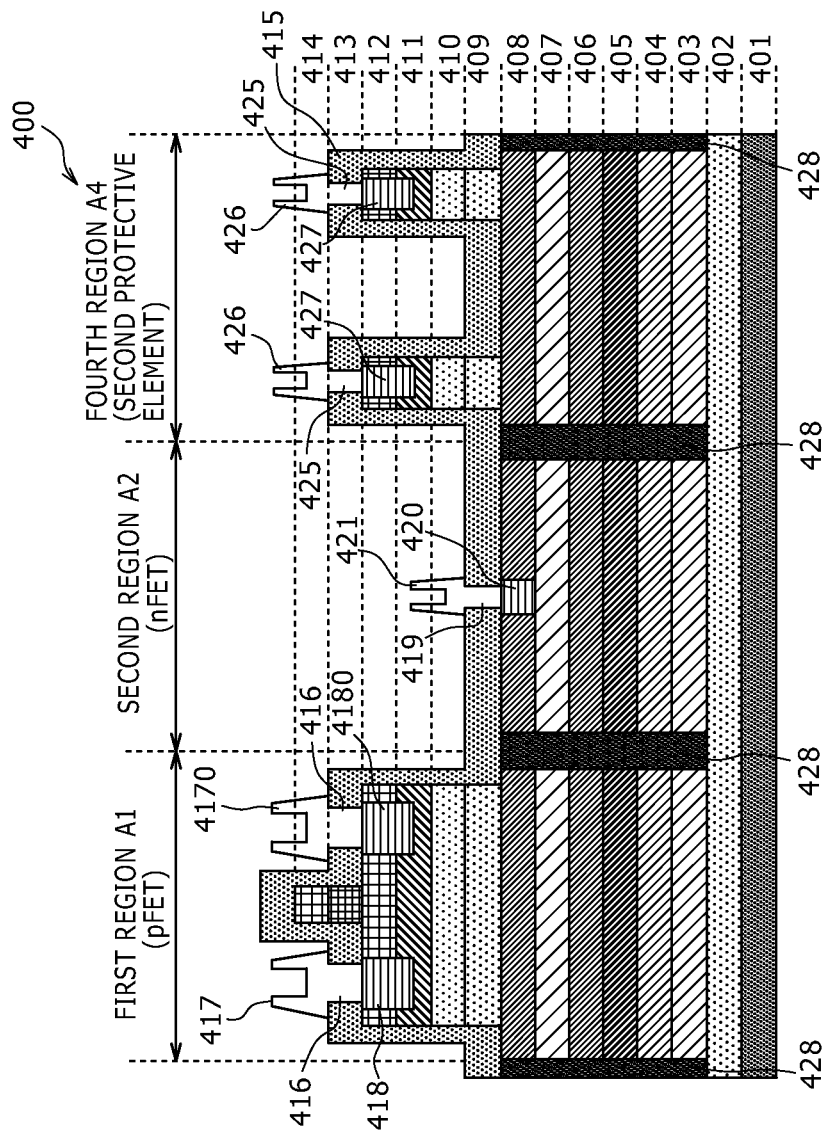
FIG. 6 is a schematic sectional view of a semiconductor device according to a fourth embodiment.

FIG. 6 is a schematic longitudinal sectional view of a semiconductor device 400 according to a fourth embodiment of the present technique. In the semiconductor device 400, the same part or the part having the same function as a part given a numeral "1xx" in the above-described semiconductor device 100 is given a numeral "4xx" in which the numbers of "xx" are the same.

As shown in FIGS. 5 and 6, the semiconductor devices 300 and 400 do not need to include both the first protective element and the second protective element and may have a configuration including either one of the first protective element and the second protective element. It is apparent that such semiconductor devices 300 and 400 also have operational effects similar to those of the above-described first embodiment.

It is obvious that the semiconductor device 200 according to the second embodiment may also have a configuration including either one of the first protective element and the second protective element like the semiconductor devices according to the third embodiment and the fourth embodiment.

The technical scope of the present technique is not limited to the above-described embodiments and includes also configurations obtained by mutual substitution or combination change of the respective configurations disclosed in the above-described embodiments, configurations obtained by mutual substitution or combination change of the respective configurations disclosed in publicly-known techniques and the above-described embodiments, and so forth. The technical scope of the present technique is not limited to the above-described embodiments and covers the items set forth in the claims and equivalents thereof.

(E) Summarization

As described above, according to the embodiments of the present technique, the following semiconductor device and a manufacturing method of this semiconductor device can be provided. Specifically, the semiconductor device includes an epitaxial substrate formed by stacking a plurality of kinds of semiconductors over one semiconductor substrate by epitaxial growth, a field effect transistor of a first conductivity type formed in a first region of the epitaxial substrate by utilizing a stacking structure of the epitaxial substrate, a field effect transistor of a second conductivity type formed in a second region different from the first region of the epitaxial substrate by utilizing a stacking structure of the epitaxial substrate, and a protective element formed in a third region different from the first region and the second region of the epitaxial substrate by utilizing a stacking structure of the epitaxial substrate. The protective element includes a first stacking structure formed by etching the epitaxial substrate by vertical etching that proceeds in a stacking thickness direction and a second stacking structure formed by etching the epitaxial substrate by vertical etching that proceeds in a stacking thickness direction. The protective element has two PN junctions on a current path formed between an upper end of the first stacking structure and an upper end of the second stacking structure via a base part of the first stacking structure and the second stacking structure. This permits a wide variety of element design and can realize a structure enabling easy enhancement in the performance, the degree of integration, the withstand voltage, and so forth of the semiconductor device.

The present technique can also take the following configurations.

(1) A semiconductor device including:

an epitaxial substrate formed by stacking a plurality of kinds of semiconductors over one semiconductor substrate by epitaxial growth;

a field effect transistor of a first conductivity type formed in a first region of the epitaxial substrate by utilizing a stacking structure of the epitaxial substrate;

a field effect transistor of a second conductivity type formed in a second region different from the first region of the epitaxial substrate by utilizing a stacking structure of the epitaxial substrate; and a protective element formed in a third region different from the first region and the second region of the epitaxial substrate by utilizing a stacking structure of the epitaxial substrate, in which the protective element includes a first stacking structure formed by etching the epitaxial substrate by vertical etching that proceeds in a stacking thickness direction, and a second stacking structure formed by etching the epitaxial substrate by vertical etching that proceeds in a stacking thickness direction, and the protective element has two PN junctions on a current path formed between an upper end of the first stacking structure and an upper end of the second stacking structure via a base part of the first stacking structure and the second stacking structure.

(2) The semiconductor device according to (1), in which the protective element includes one of an N-type epitaxial layer and a P-type epitaxial layer stacked in the epitaxial substrate.

(3) The semiconductor device according to (1) or (2), in which the protective element includes a P-type semiconductor layer and an N-type semiconductor layer that are stacked in the epitaxial substrate and an i-type semiconductor layer stacked between the P-type semiconductor layer and the N-type semiconductor layer.

(4) The semiconductor device according to any one of (1) to (3), in which the protective element includes a junction of a P-N-P-N-P type.

(5) The semiconductor device according to any one of (1) to (3), in which the protective element includes a junction of a P-N-i-P-i-N-P type.

(6) The semiconductor device according to any one of (1) to (5), in which the protective element includes a junction of a P-i-N-i-P type.

(7) The semiconductor device according to any one of (1) to (6), in which the epitaxial substrate includes a heterojunction.

(8) The semiconductor device according to any one of (1) to (7), in which the epitaxial substrate includes a heterojunction formed by disposing an $Al_{1-x}Ga_xAs$ layer (x=0.1 to 0.5) between two GaAs layers.

(9) The semiconductor device according to any one of (1) to (8), in which the epitaxial substrate includes a heterojunction formed by disposing an $In_{1-x}Ga_xP$ layer (x=0.51) between two GaAs layers.

(10) The semiconductor device according to any one of (1) to (9), in which the epitaxial substrate includes a heterojunction formed by disposing an $Al_{1-x}Ga_xAs$ layer (x=0.1 to 0.5) and an $In_{1-x}Ga_xP$ layer (x=0.51) between two GaAs layers.

(11) The semiconductor device according to any one of (1) to (10), in which the upper end of the first stacking structure and the upper end of the second stacking structure are terminated by a P-type region formed by diffusion of a P-type impurity.

(12) The semiconductor device according to any one of (1) to (11), the epitaxial substrate is formed by sequentially stacking, by epitaxial growth, the stacking structure used to form the field effect transistor of the first conductivity type and the stacking structure used to form the field effect transistor of the second conductivity type over one compound semiconductor substrate.

(13) A manufacturing method of a semiconductor device, the method including:

forming an epitaxial substrate by stacking a plurality of kinds of semiconductors over one semiconductor substrate by epitaxial growth;

forming a field effect transistor of a first conductivity type in a first region of the epitaxial substrate by utilizing a stacking structure of the epitaxial substrate;

forming a field effect transistor of a second conductivity type in a second region different from the first region of the epitaxial substrate by utilizing a stacking structure of the epitaxial substrate; and forming a protective element in a third region different from the first region and the second region of the epitaxial substrate by utilizing a stacking structure of the epitaxial substrate, in which forming the protective element includes forming a first stacking structure by etching the epitaxial substrate by vertical etching that proceeds in a stacking thickness direction, and forming a second stacking structure by etching the epitaxial substrate by vertical etching that proceeds in a stacking thickness direction, and by forming the protective element, two PN junctions are formed on a current path formed between an upper end of the first stacking structure and an upper end of the second stacking structure via a base part of the first stacking structure and the second stacking structure.

(14) A protective element including:

an epitaxial substrate formed by stacking a plurality of kinds of semiconductors by epitaxial growth;

a first stacking structure formed by etching the epitaxial substrate by vertical etching that proceeds in a stacking thickness direction; and a second stacking structure formed by etching the epitaxial substrate by vertical etching that proceeds in a stacking thickness direction, in which two PN junctions exist on a current path formed between an upper end of the first stacking structure and an upper end of the second stacking structure via a base part of the first stacking structure and the second stacking structure.

(15) A manufacturing method of a protective element, the method including:

forming an epitaxial substrate by stacking a plurality of kinds of semiconductors by epitaxial growth;

forming a first stacking structure by etching the epitaxial substrate by vertical etching that proceeds in a stacking thickness direction; and forming a second stacking structure by etching the epitaxial substrate by vertical etching that proceeds in a stacking thickness direction, in which two PN junctions are formed on a current path formed between an upper end of the first stacking structure and an upper end of the second stacking structure via a base part of the first stacking structure and the second stacking structure by forming the epitaxial substrate, forming the first stacking structure, and forming the second stacking structure.

The present disclosure contains subject matter related to that disclosed in Japanese Priority Patent Application JP 2012-041113 filed in the Japan Patent Office on Feb. 28, 2012, the entire content of which is hereby incorporated by reference.

What is claimed is:

1. A semiconductor device comprising:
an epitaxial substrate formed by stacking a plurality of kinds of semiconductors over one semiconductor substrate by epitaxial growth;
a field effect transistor of a first conductivity type formed in a first region of the epitaxial substrate by utilizing a stacking structure of the epitaxial substrate;
a field effect transistor of a second conductivity type formed in a second region different from the first region of the epitaxial substrate by utilizing a stacking structure of the epitaxial substrate; and
a protective element formed in a third region different from the first region and the second region of the epitaxial substrate by utilizing a stacking structure of the epitaxial substrate,
wherein the protective element includes
a first stacking structure formed by etching the epitaxial substrate by vertical etching that proceeds in a stacking thickness direction, and
a second stacking structure formed by etching the epitaxial substrate by vertical etching that proceeds in a stacking thickness direction, and
the protective element has two PN junctions on a current path formed between an upper end of the first stacking structure and an upper end of the second stacking structure via a base part of the first stacking structure and the second stacking structure.

2. The semiconductor device according to claim 1, wherein the protective element includes one of an N-type epitaxial layer and a P-type epitaxial layer stacked in the epitaxial substrate.

3. The semiconductor device according to claim 1, wherein the protective element includes a P-type semiconductor layer and an N-type semiconductor layer that are stacked in the epitaxial substrate and an i-type semiconductor layer stacked between the P-type semiconductor layer and the N-type semiconductor layer.

4. The semiconductor device according to claim 1, wherein the protective element includes a junction of a P-N-P-N-P type.

5. The semiconductor device according to claim 1, wherein the protective element includes a junction of a P-N-i-P-i-N-P type.

6. The semiconductor device according to claim 1, wherein the protective element includes a junction of a P-i-N-i-P type.

7. The semiconductor device according to claim 1, wherein the epitaxial substrate includes a heterojunction.

8. The semiconductor device according to claim 1, wherein the epitaxial substrate includes a heterojunction formed by disposing an $Al_{1-x}Ga_xAs$ layer (x=0.1 to 0.5) between two GaAs layers.

9. The semiconductor device according to claim 1, wherein the epitaxial substrate includes a heterojunction formed by disposing an $In_{1-x}Ga_xP$ layer (x=0.51) between two GaAs layers.

10. The semiconductor device according to claim 1, wherein the epitaxial substrate includes a heterojunction formed by disposing an $Al_{1-x}Ga_xAs$ layer (x=0.1 to 0.5) and an $In_{1-x}Ga_xP$ layer (x=0.51) between two GaAs layers.

11. The semiconductor device according to claim 1, wherein the upper end of the first stacking structure and the upper end of the second stacking structure are terminated by a P-type region formed by diffusion of a P-type impurity.

12. The semiconductor device according to claim 1, wherein the epitaxial substrate is formed by sequentially stacking, by epitaxial growth, the stacking structure used to form the field effect transistor of the first conductivity type and the stacking structure used to form the field effect transistor of the second conductivity type over one compound semiconductor substrate.

13. A manufacturing method of a semiconductor device, the method comprising:
forming an epitaxial substrate by stacking a plurality of kinds of semiconductors over one semiconductor substrate by epitaxial growth;
forming a field effect transistor of a first conductivity type in a first region of the epitaxial substrate by utilizing a stacking structure of the epitaxial substrate;
forming a field effect transistor of a second conductivity type in a second region different from the first region of the epitaxial substrate by utilizing a stacking structure of the epitaxial substrate; and
forming a protective element in a third region different from the first region and the second region of the epitaxial substrate by utilizing a stacking structure of the epitaxial substrate,
wherein forming the protective element includes
forming a first stacking structure by etching the epitaxial substrate by vertical etching that proceeds in a stacking thickness direction, and
forming a second stacking structure by etching the epitaxial substrate by vertical etching that proceeds in a stacking thickness direction, and
by forming the protective element, two PN junctions are formed on a current path formed between an upper end of the first stacking structure and an upper end of the second stacking structure via a base part of the first stacking structure and the second stacking structure.

14. A protective element comprising:
an epitaxial substrate formed by stacking a plurality of kinds of semiconductors by epitaxial growth;
a first stacking structure formed by etching the epitaxial substrate by vertical etching that proceeds in a stacking thickness direction; and
a second stacking structure formed by etching the epitaxial substrate by vertical etching that proceeds in a stacking thickness direction,
wherein two PN junctions exist on a current path formed between an upper end of the first stacking structure and an upper end of the second stacking structure via a base part of the first stacking structure and the second stacking structure.

15. A manufacturing method of a protective element, the method comprising:
forming an epitaxial substrate by stacking a plurality of kinds of semiconductors by epitaxial growth;
forming a first stacking structure by etching the epitaxial substrate by vertical etching that proceeds in a stacking thickness direction; and
forming a second stacking structure by etching the epitaxial substrate by vertical etching that proceeds in a stacking thickness direction,
wherein two PN junctions are formed on a current path formed between an upper end of the first stacking structure and an upper end of the second stacking structure via a base part of the first stacking structure and the second stacking structure by forming the epitaxial substrate, forming the first stacking structure, and forming the second stacking structure.

* * * * *